United States Patent [19]
Siddons et al.

[11] Patent Number: 5,679,502
[45] Date of Patent: Oct. 21, 1997

[54] METHOD AND APPARATUS FOR MICROMACHINING USING HARD X-RAYS

[75] Inventors: David Peter Siddons, Shoreham; Erik D. Johnson, Ridge, both of N.Y.; Henry Guckel; Jonathan L. Klein, both of Madison, Wis.

[73] Assignee: Wisconsin Alumni Research Foundation, Madison, Wis.

[21] Appl. No.: 405,662

[22] Filed: Mar. 15, 1995

[51] Int. Cl.⁶ .................................................. B23P 17/00
[52] U.S. Cl. ................... 430/397; 205/118; 205/125; 378/34; 378/35; 378/156; 378/157; 430/312; 430/313; 430/315; 430/324; 430/326; 430/331; 430/396; 430/967; 430/966
[58] Field of Search ........................ 205/118, 125; 29/598, 596; 378/34, 35, 157, 156, 902; 430/967, 966, 286.1, 269, 275.1, 311, 313, 315, 320, 321, 324, 326, 330, 331, 396, 397, 394, 312

[56] References Cited

U.S. PATENT DOCUMENTS

| | | | |
|---|---|---|---|
| 3,974,386 | 8/1976 | Mistretta et al. | 378/157 |
| 5,033,075 | 7/1991 | DeMone et al. | 378/156 |
| 5,045,438 | 9/1991 | Adachi | 430/945 |
| 5,063,582 | 11/1991 | Mori et al. | 378/34 |
| 5,063,586 | 11/1991 | Jewell et al. | 378/34 |
| 5,189,777 | 3/1993 | Guckel et al. | 430/967 |
| 5,190,637 | 3/1993 | Guckel | 205/118 |
| 5,206,983 | 5/1993 | Guckel et al. | 29/598 |
| 5,327,033 | 7/1994 | Guckel et al. | 310/40 MM |
| 5,357,807 | 10/1994 | Guckel et al. | 73/721 |
| 5,378,583 | 1/1995 | Guckel et al. | 430/967 |

FOREIGN PATENT DOCUMENTS

| | | | |
|---|---|---|---|
| 58-112329 | 7/1983 | Japan . | |
| 5-326381 | 12/1993 | Japan | 378/35 |

OTHER PUBLICATIONS

"Introduction to Microlithography" Thompson et al. (1983) pp. 74–81.

Spiller et al. "Application of Synchrotron radiation to x–ray lithography" J. Appl. Phys. vol. 47, No. 12, (Dec. 1976) pp. 5450–5459.

Guckel, H., et al., "Fabrication of Assembled Micromechanical Components via Deep X–Ray Lithography," Proc. of IEEE Micro Electro Mechanical Systems, Jan. 30 –Feb. 2, 1991, pp. 74–79.

Hagmann, et al., "Fabrication of Microstructures of Extreme Structural Heights by Reaction Injection Molding," Int'l. Polymer Processing IV, vol. 3, 1989, pp. 188–195.

Guckel, H., et al., "Deep X–Ray and UV Lithographies for Micromechanics," Tech. Digest, Solid State Sensor and Actuator Workshop, Hilton Head, S.C., Jun. 4–7, 1990, pp. 118–122.

Ehrfeld, W., et al., "LIGA Process: Sensor Construction Techniques Via X–Ray Lithography," Technical Digest IEEE Solid–State Sensor and Actuator Workshop, 1988, pp. 1–4.

Siddons, D.P., et al., "Precision Machining Using Hard X–Rays," Synchrotron Radiation News, vol. 7, No. 2, Mar. 18, 1994, pp. 16–17. Only part of article.

Guckel, H., et al., "Processing and Design Considerations for High Force Output—Large Throw Electrostatic, Linear Micro Actuators," Actuator 94, Bremen, West Germany, Jun. 15–17, 1994, pp. 1–4.

Brauer, Elke, et al., "Experimental Verification of Photon: A Program for Use in X–Ray Shielding Calculations," Nuclear Instruments and Methods in Physics Research A266, North–Holland, Amsterdam, 1988, pp. 195–198.

Chapman, Dean, et al., "Photon: A Program for Synchrotron Radiation Dose Calculations," Nuclear Instruments and Methods in Physics Research A266, North–Holland, Amsterdam, 1988, pp. 191–194.

"X–Ray Technique Makes Large Micromachines," Advanced Manufacturing Technology newsletter, vol. 15, No. 2, Mar. 15, 1994, pp. 1–2.

"New Precision–Machining Technique Developed at BNL," World Power Systems Intelligence, Forecast International 1994, Newton, CT, Feb. 16, 1994, p. 8.

"BNL Developing New X–Ray Casting System," Lab Watch, New Technology Week, Feb. 22, 1994, p. 8.

"New Precision Machining Technique," Technology Watch, McGraw–Hill's Federal Technology Report, Mar. 3, 1994, p.17.

"Machining Large Components," Technology Watch, McGraw–Hill's Federal Report, Aug. 4, 1994, p. 13.

"Lithographic Machining for Large Objects," News & Notes, Mechanical Engineering, Jul. 16, 1994.

"Process Research Adds New Micromachine Materials," R & D Magazine, Jan. 1994, p. 37.

"At NSLS: From 'Big Machine' to Tiny, Precision–Machined Parts," Brookhaven National Laboratory, Brookhaven Bulletin newsletter, vol. 48, No. 9, Mar. 4, 1994.

*Primary Examiner*—Martin Angebranndt
*Attorney, Agent, or Firm*—Foley & Lardner

[57] ABSTRACT

An X-ray source such as a synchrotron which provides a significant spectral content of hard X-rays is used to expose relatively thick photoresist such that the portions of the photoresist at an exit surface receive at least a threshold dose sufficient to render the photoresist susceptible to a developer, while the entrance surface of the photoresist receives an exposure which does not exceed a power limit at which destructive disruption of the photoresist would occur. The X-ray beam is spectrally shaped to substantially eliminate lower energy photons while allowing a substantial flux of higher energy photons to pass through to the photoresist target. Filters and the substrate of the X-ray mask may be used to spectrally shape the X-ray beam. Machining of photoresists such as polymethylmethacrylate to micron tolerances may be obtained to depths of several centimeters, and multiple targets may be exposed simultaneously. The photoresist target may be rotated and/or translated in the beam to form solids of rotation and other complex three-dimensional structures.

46 Claims, 17 Drawing Sheets

METHOD AND APPARATUS FOR MICROMACHINING USING HARD X-RAYS

This invention was made in part with Government support under contract number DE-AC02-76CH00016, between the U.S. Department of Energy and Associated Universities, Inc. The Government has certain rights in the invention.

FIELD OF THE INVENTION

This invention pertains generally to the field of micromechanical devices and processing techniques therefor, and particularly to micromechanical machining using X-rays.

BACKGROUND OF THE INVENTION

In lithography processes, a thin film of a photoresist material is typically coated onto a substrate and a pattern of light is impressed on it to cause a chemical change which allows the pattern of light and dark to be replicated in the layer on subsequent chemical treatment (called development). The exposure process may involve breaking chemical bonds in a positive photoresist polymer material, thereby rendering these exposed regions susceptible to dissolution or other chemical attack by the developer. If a negative photoresist is used, the exposed areas are less susceptible to dissolution by a developer than the unexposed areas. The requirement of breaking or making chemical bonds imposes a lower limit on the energy of the photons which can be used in the process. Typically, commercial resists used in the semiconductor industry rely on some optical resonance in the resist to enhance the cross-section for bond rupture by visible light photons. The strong absorption of photons in the resist prevents penetration of the light more than a few microns into the resist layer. The lithography processes used in the semiconductor industry are capable of replicating submicron features in quantity. This capacity for producing extremely fine and precise detail makes lithography processes potentially attractive also for the fabrication of highly miniaturized mechanical components.

Deep X-ray lithography generally involves a substrate which is covered by a thick photoresist, typically several hundred microns in thickness, which is exposed through a mask by X-rays. X-ray photons are much more energetic than optical photons, which makes complete exposure of thick photoresist films feasible and practical. The use of a synchrotron for the X-ray source yields high flux densities—several watts per square centimeter—combined with excellent collimation to produce thick photoresist exposures without any horizontal run-out. Locally exposed patterns should therefore produce vertical photoresist walls if a developing system with very high selectivity between exposed and unexposed photoresist is available. This requirement is satisfied for polymethylmethacrylate (PMMA) as the X-ray photoresist and various developing systems. See, H. Guckel, et al., "Deep X-ray and UV Lithographies For Micromechanics" Technical Digest, Solid State Sensor and Actuator Workshop, Hilton Head, S.C., Jun. 4–7, 1990, pp. 118–122.

Deep X-ray lithography may be combined with electroplating to form high aspect ratio structures. This requires that the substrate be furnished with a suitable plating base prior to photoresist application. Typically this involves a sputtered film of adhesive metal such as chromium or titanium which is followed by a thin film of the metal which is to be plated. Exposure through a suitable mask and development are followed by electroplating. This results, after cleanup, in fully attached metal structures with very high aspect ratios. Such structures were first reported by W. Ehrfeld and coworkers at the Institute for Nuclear Physics at the National Laboratory at Karlsruhe in West Germany. Ehrfeld termed the process "LIGA" based on the first letters of the German words for lithography and electro-plating. A general review of the LIGA process is given in the article by W. Ehrfeld, et al., "LIGA Process: Sensor Construction Techniques Via X-Ray Lithography" Technical Digest IEEE Solid-State Sensor and Actuator Workshop, 1988, pp. 1–4.

The addition of a sacrificial layer to the LIGA process facilitates the fabrication of fully attached, partially attached, or completely free metal structures. Because device thicknesses are typically larger than 10 microns, freestanding structures will not distort geometrically if reasonable strain control for the plated film is achieved. This fact makes assembly in micromechanics possible and thereby leads to nearly arbitrary three-dimensional structures. See H. Guckel, et al., "Fabrication of Assembled Micromechanical Components via Deep X-Ray Lithography," Proceedings of IEEE Micro Electro Mechanical Systems, Jan. 30–Feb. 2, 1991, pp. 74–79; and U.S. Pat. No. 5,189,777 to Guckel, et al. Further extensions of the LIGA process have included the formation of magnetically driven micromechanical rotating motors, as shown in U.S. Pat. Nos. 5,206,983 and 5,327,033 to Guckel, et al. Complex multiple layer microstructures can be formed of metal, which can include sacrificial metal layers which are etched away by an etchant which does not affect the primary metal, as shown in U.S. Pat. No. 5,190,637 to Guckel. Significant improvements in the formation of microstructures, particularly those with very high aspect ratios, is obtained utilizing a preformed photoresist sheet, as described in U.S. Pat. No. 5,378,583 to Guckel, et al.

The use of a preformed photoresist sheet, for example, formed of PMMA, in theory would allow relatively large structures to be machined in the photoresist by the above-described X-ray machining processes. However, as the thickness of the photoresist is increased, e.g., beyond 500 µm, difficulties are encountered with the relatively soft (lower photon energy) X-ray sources conventionally used for LIGA processing. The wavelengths of soft X-rays are long enough that diffraction effects can lead to penumbral blurring of the X-ray mask shadow image. Difficulties can also arise from interference phenomena caused by the non-negligible reflectivity of common photoresist materials with respect to soft X-rays.

It has also been found that for resist sheets thicker than about 500 µm soft X-rays cannot penetrate sufficiently to the bottom of the resist layer to guarantee development of the bottom regions of the resist without such a large exposure that the dose to the upper regions of the resist would become so high as to cause destructive overexposure. The stresses involved in this destruction of the upper resist regions can cause distortion or fracture of the adjacent portions of the resist, or even destruction of the fragile soft X-ray mask which is typically positioned within a few microns of the resist layer. It is found that lower energy X-ray photons are substantially absorbed as the photons pass through the photoresist target. To provide an X-ray exposure dose at the bottom of a thick photoresist that exceeds the threshold dose at which the photoresist becomes susceptible to removal by a developer may require a significantly longer period of exposure in the X-ray beam than is required for full development of a thinner photoresist. Furthermore, the continuing absorption of X-ray photons at the top or entrance surface and in the shallower regions of the photoresist can result in severe bubbling of the photoresist at and near the top surface. Severe bubbling can harm the quality of the side walls between the exposed and unexposed regions of the photoresist, and can even do damage to the X-ray mask, which typically must be placed within a few microns of the photoresist target where relatively soft, longer wavelength X-rays are used.

SUMMARY OF THE INVENTION

In accordance with the present invention, precision micromachining of thick photoresist materials is obtained using hard (high energy) X-rays. A highly collimated beam from a source such as a synchrotron having a significant spectral content of hard X-rays is used to expose a relatively thick photoresist with preferably modest variation in dose through the photoresist. The portions of the photoresist at the bottom or exit surface receive at least a threshold dose sufficient to render the photoresist susceptible to a developer, while the top or entrance surface of the photoresist receives an exposure which does not exceed a power limit at which destructive disruption or bubbling of the photoresist would occur.

In accordance with the invention, the X-ray beam from the source is spectrally shaped to substantially eliminate lower energy photons which have a short absorption length in the photoresist, and which would tend to be substantially absorbed near the top surface of the photoresist. The spectrally shaped beam contains primarily higher energy photons (e.g., above about 5000 eV and preferably above about 10,000 eV) which have an absorption length comparable to the photoresist thickness and are therefore relatively uniformly absorbed throughout the thickness of the photoresist. Despite the reduced absorption rate of the higher energy photons as compared to lower energy photons, the processing of thicker photoresist can be carried out over a length of time similar to that for a much thinner photoresist by providing a higher flux of the high energy photons from the X-ray source than could be tolerated by the photoresist at lower photon energies. Thus, by utilizing the present invention, it is possible to obtain machining of photoresists such as polymethylmethacrylate (PMMA) to micron tolerances and to depths of a centimeter or even several centimeters. Moreover, the very short wavelength (e.g., on the order of $10^{-10}$ meter) of the hard X-rays which are used for exposures minimizes diffraction and reflection effects, allowing smaller structures to be formed, and allowing the X-ray mask to be spaced much farther from the photoresist target than was possible with X-ray sources having longer wavelength X-ray content.

The spectrally shaped hard X-rays of the present invention may be utilized to form complex three-dimensional precision machined objects by exposing a photoresist through an appropriately shaped mask and rotating and/or translating the photoresist in the patterned beam passed through the X-ray mask. By rotating the photoresist in the patterned beam, it is possible to machine solids of rotation into the photoresist by exposing peripheral portions of the rotating photoresist spaced from the axis of rotation to a dose greater than the threshold dose, while shielding central portions adjacent the axis of rotation so that such portions receive less than the threshold dose. Subsequent development of the exposed photoresist in a developer removes the peripheral portions. Complex structures may also be formed by selectively moving the photoresist in the patterned beam passed through the X-ray mask so that some portions of the photoresist receive a dose which is less than the threshold dose during an exposure in one position of the photoresist, and receive no dose in a moved position of the photoresist, while other portions of the photoresist receive multiple exposures and a cumulative dose which is greater than the threshold dose.

In the present invention, the penetrating ability of the hard X-rays allows the X-ray mask to be formed on robust substrates, such as relatively thick and wide single crystal silicon wafers, on which an X-ray absorber such as gold is deposited in a pattern. The ability to use relatively thick X-ray mask substrates (e.g., 300 to 400 µm thick silicon) greatly reduces the cost of mask production as compared to the very thin and fragile mask substrates required for soft X-ray masks, and allows much wider masks to be made (e.g., 4 to 6 inches in diameter) because of the greater structural strength of the thicker substrate, thereby allowing exposure of a wide target to increase batch production. The thicker mask is also more durable and can be used for many more exposures than a thin mask.

The very short wavelengths of the preferred hard X-rays eliminates the problems of diffraction and ghost-imaging due to partial reflections encountered with soft X-rays, thus permitting very large spacings between the mask and the target (e.g., several centimeters or even tens of centimeters) if the beam is well collimated. Spacing the mask relatively far away from the target photoresist minimizes the possibility of damage to the X-ray mask due to accidental contact between the photoresist and the mask or bubbling up of exposed portions of the photoresist, and the large spacing between the mask and photoresist further allows the photoresist to be rotated or translated without interference from the mask. Moreover, the ability to space the mask a significant distance from the target, and the ability of the hard X-rays to penetrate through both the photoresist target and typical photoresist carrier substrates with minimum attenuation allows simultaneous exposure of a stack of several substrate supported photoresists, thereby providing increased batch production rates.

The exposure of the deep photoresist can be facilitated by controlled heating of the photoresist during exposure to enhance the mobility of volitile species in the bulk of the photoresist to minimize formation of large disruptive gas bubbles in the exposed photoresist.

Further objects, features and advantages of the invention will be apparent from the following detailed description when taken in conjunction with the accompany drawings.

DETAILED DESCRIPTION OF THE INVENTION

Figure 1:
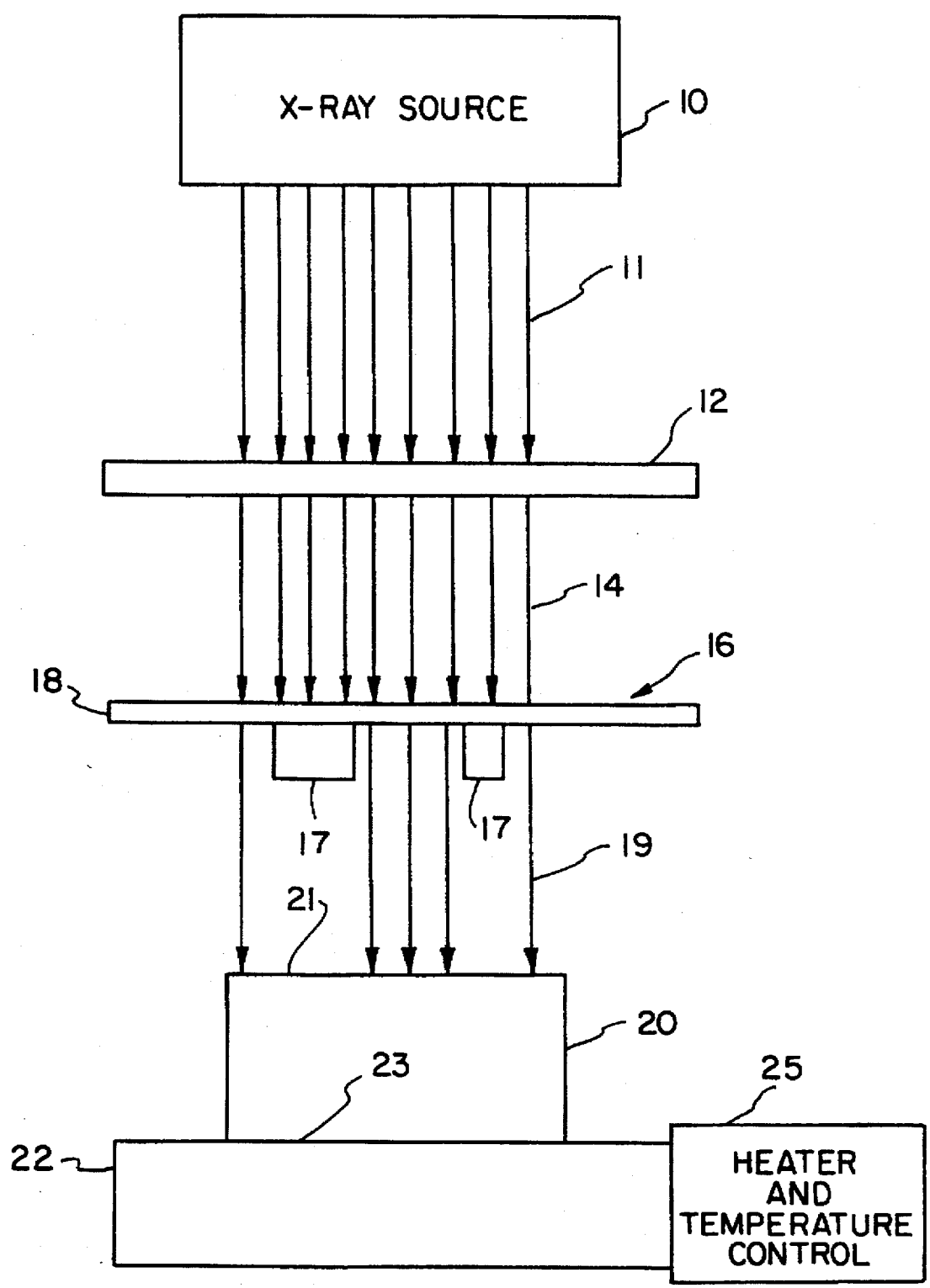
FIG. 1 is a simplified view of an X-ray exposure apparatus in accordance with the invention illustrating a photoresist sample which is exposed through a filter and a mask by an X-ray beam from an X-ray source.

The present invention may be exemplified with respect to the schematic view of FIG. 1 in which radiation from a high energy X-ray source 10 is projected in a beam 11. The X-ray beam 11 is preferably highly collimated, either by using optical means to collimate a diverging beam or by utilizing a source such as a synchrotron which produces a collimated beam. The degree of collimation required is dictated by the penumbral blurring and runout requirements of the part to be fabricated, which can be readily determined because diffraction effects are not significant with short wavelength X-rays. An example of a suitable high energy source is the 2,584 GeV synchrotron of the National Synchrotron Light Source (NSLS), at Brookhaven National Laboratory. The collimated beam 11 is provided from the source 10 to an exposure station in a conventional manner. In the present invention, the beam 11 is passed to a spectral shaping filter 12 to provide a spectrally shaped beam 14 which then passes through an X-ray mask 16 having a pattern of X-ray absorbers 17, which may be formed on a support substrate or membrane 18, to produce a patterned beam 19 which is incident upon a photoresist target 20, initially entering the top or entrance surface 21 of the resist. Although a separate filter 12 and mask substrate 18 are shown in FIG. 1, it will be apparent that the filter and mask substrate can be combined, and a separate filter element eliminated entirely, that the substrate 18 may also function in part as a filter, and that the absorber pattern of the mask may in some cases be self supporting so that no mask substrate is used.

While any suitable positive or negative photoresist may be utilized, the present invention may be exemplified with respect to polymethylmethacrylate (PMMA) which is a convenient X-ray photoresist having well known properties. The PMMA photoresist 20 may be formed as a preformed sheet of PMMA which is cut to size for the particular application. In the present invention, relatively thick photoresist targets may be machined, for example, photoresist sheets and blocks having thicknesses in the range of 0.5 mm to several centimeters (e.g., to 10 cm or more in PMMA, including commercial PMMA such as Lucite™ sheets or blocks). The target may be suspended in any desired way in the beam, with or without a backing or substrate, and fixed in orientation relative to the patterned beam 19 or mounted for rotation and/or translation. In the illustrative view of FIG. 1, a backplate 22 is provided against which the bottom or exit surface 23 of the photoresist target 20 is mounted. The backplate 22 (e.g., formed of metal such as aluminum) provides physical support for the photoresist 20 and also can serve to control the temperature of the photoresist during the exposure. The bottom surface 23 of the photoresist is preferably in good heat transfer contact with the backplate 22 by any desired manner of securing the resist 20 in position on the backplate 22, e.g., with clips, clamps, a mounting frame, adhesive, and so forth. Where the resist target 20 is to be rotated, a backplate generally is not used and the target 20 is suspended from an edge or edges to allow rotation of the target in the beam. Where the X-ray exposure is to be followed by electroplating metal into the developed resist, the resist may be secured to a substrate 22 which has a plating base formed on the surface thereof to which the resist is secured. Where the resist target 20 is to be rotated, temperature control may be achieved by applying a stream of fluid at a controlled temperature which flows around the resist.

As generally illustrated in FIG. 1, and in contrast to typical fixturing requirements for exposures using soft X-rays, a substantial spacing may be provided between the X-ray mask 16 and the top surface 21 of the photoresist target 20. This spacing may be, for example, 5 mm, but generally will be at least one centimeter or even several centimeters. The relatively large physical spacing between the photoresist 20 and the support membrane 18 of the X-ray mask 16 minimizes the likelihood of accidental contact between the photoresist and the mask, which could damage the mask, and also minimizes the possibility of bubbles formed on the photoresist contacting the X-ray mask.

The heat transfer contact between the surface of the backplate 22 and the bottom surface 23 of the photoresist target 20 allows control of the temperature of the target 20. For example, the temperature of the metal backplate 22 can be monitored and its temperature controlled by applying heat to or drawing heat from the backplate, for example, by using a heater 25 with a temperature controller to heat up the backplate 22 and maintain it at a desired temperature, or by using a refrigerator or cooler unit connected to the backplate to draw heat away which is generated from X-rays absorbed in the backplate and heat transferred from the resist to the backplate. The photoresist target 20 will have a bulk temperature approximately the same as the temperature of the backplate, thus allowing some control over the temperature of the photoresist target itself. A controlled amount of heating of the backplate allows the photoresist 20 to be heated above ambient and facilitates evolution of gases from the exposed portions of the photoresist as explained further below. The fixture which mounts the photoresist target 20 and X-ray mask in position may be moved back and forth in a plane perpendicular to the incoming X-ray beam 19 to allow the beam to scan across the entire length and/or breadth of the photoresist target in a conventional fashion.

Because of the ability of the spectrally filtered X-rays to penetrate through substantial thicknesses of photoresist, the resist 20 may comprise a plurality of sheets of preformed resist which are stacked together and exposed simultaneously. The individual sheets may then be developed and used for various purposes. For example, an individual sheet may be of a desired thickness for microcomponent fabrication, e.g., in the range of 200 µm to 1000 µm, with many such sheets stacked together to a height of one centimeter or more. After exposure, the sheets may, for example, be adhered to a substrate with a plating base thereon and developed with any of various well known developers, with subsequent electroplating of metal into the developed regions, as described in U.S. Pat. No. 5,378,583, incorporated by reference. In this manner, the production time and cost for forming LIGA structures associated with the X-ray exposures can be significantly reduced.

Figure 2:
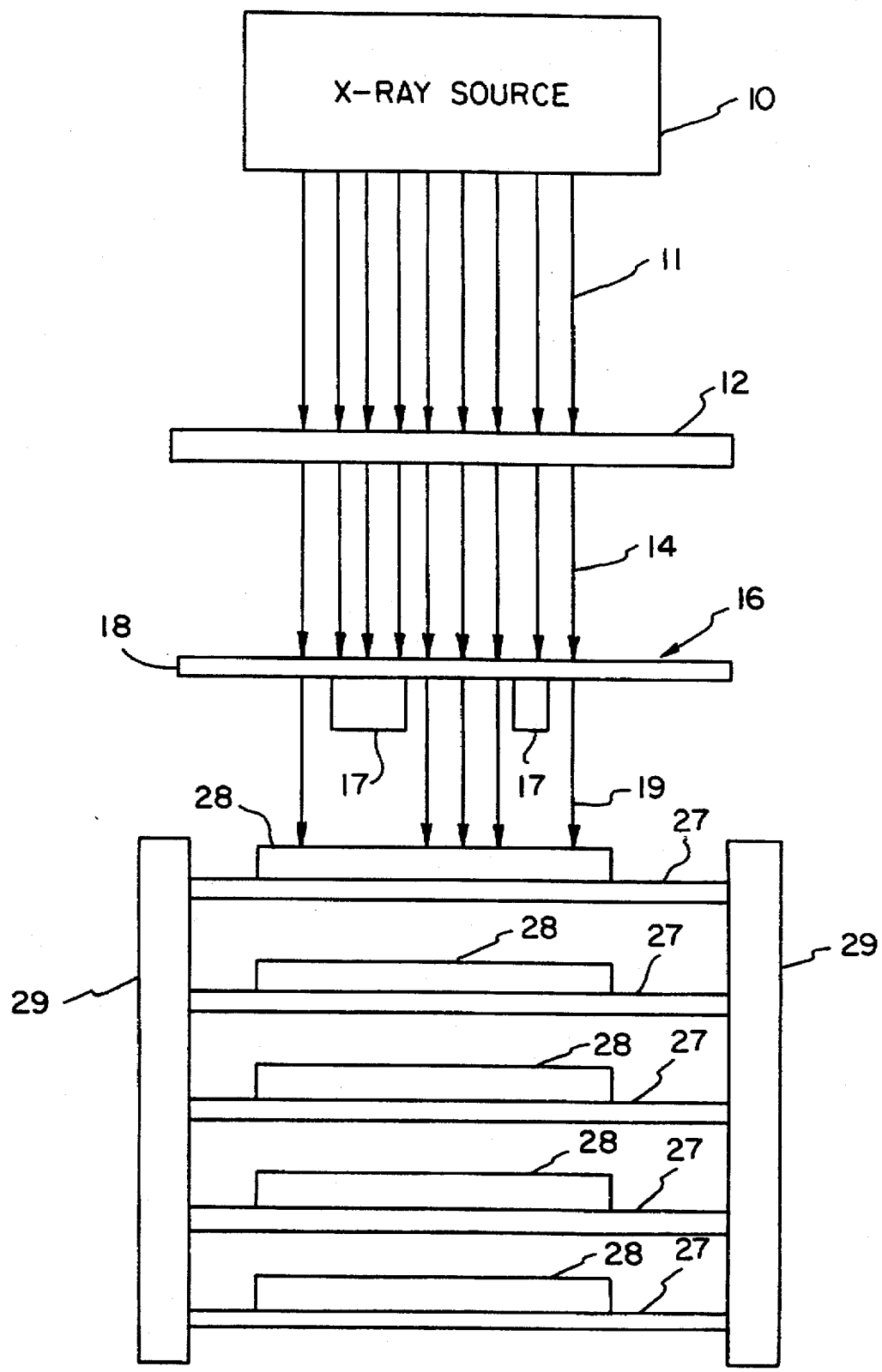
FIG. 2 is a simplified view of an X-ray exposure apparatus similar to that of FIG. 1 but for exposing several substrate supported photoresist targets simultaneously.

Similarly, the spectrally shaped X-ray beam can also penetrate common support substrates for photoresists without significant attenuation. Thus, in accordance with the invention, and as illustrated in FIG. 2, a plurality of target support substrates 27 with photoresist targets 28 formed on a surface thereof may be mounted in stacked relation in a holder 29 which engages the edges of the support substrates 27. As an example, for a support substrate 27 comprising a 400 µm thick single crystal silicon wafer with a 300 µm thick PMMA photoresist 31 carried thereon, at least ten of the substrates 27 and photoresists 28 may be stacked and simultaneously exposed. Another example of a suitable substrate is beryllium oxide, e.g., at a 250 µm thickness. Since mask diffraction effects and reflections in the photoresist 28 and substrate 27 are not significant for the spectrally shaped hard X-ray beam 19, the fact that the photoresists 28 are spaced different distances from the mask does not affect the precision of the exposure of each photoresist. Each is exposed in turn in precisely the same pattern. The substrates 27 may also have a thin plating base formed on the surface to which the photoresist 28 is secured so that electroplating can be carried out directly after development of the photoresist, as described in U.S. Pat. No. 5,378,583. Of course, in appropriate cases, the substrate 27 may comprise a semiconductor wafer (e.g., single crystal silicon) on which microelectronic circuits are to be patterned, and the photoresist 28 may be of a type conventionally used in semiconductor device formation.

Proper X-ray exposure of a thick or multiple layer photoresist requires optimization of the incoming photon spectrum from a source such as a synchrotron and an understanding of how it changes as it enters the photoresist. Typical photoresist thicknesses of interest are in the 100 micron to 1 centimeter range, although even thicker photoresists may be utilized for some applications. The photon spectrum is preferably shaped such that the dose threshold, at which the photoresist becomes susceptible to a selected developer, is reached as quickly as possible at the exit surface of the photoresist without damaging the photoresist.

The exposure requirements for thick photoresists may be illustrated with respect to two examples of X-ray sources, the National Synchrotron Light Source (NSLS) X-ray ring at Brookhaven National Laboratory, and the Synchrotron Radiation Center (SRC) at the University of Wisconsin-Madison. These electron storage rings operate at electron beam energies of 1 GeV for the SRC ring and 2.584 GeV for the NSLS ring. The radiation emitted from these devices at so called 'bend magnet' ports is naturally collimated in the vertical direction, and sweeps across the exposure field in the horizontal direction. For this reason, the exposure apparatus (e.g., filter 12, mask 16, backplate 22 and target 20 in FIG. 1) is scanned vertically through the photon beam to obtain large fields of uniform dose.

Figure 3:
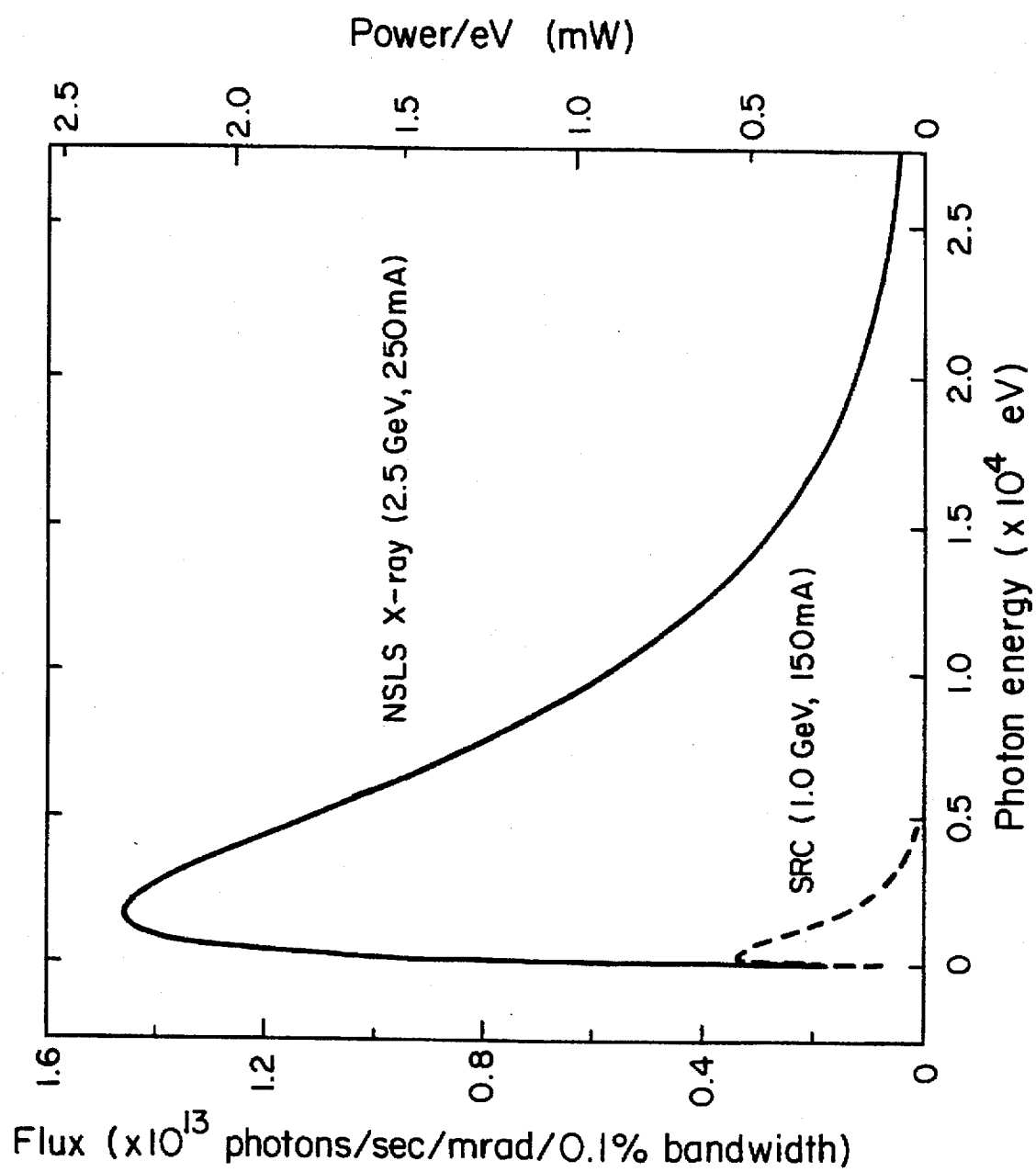
FIG. 3 are graphs showing the spectral distribution of photons per second for the NSLS synchrotron (at 250 mA) and the SRC synchrotron (at 150 mA).

Proper exposure of thick photoresist by X-rays requires optimization of the incident radiation spectrum to work within the processing parameters of the particular resist and developer system in use, accounting for the effects of resist thickness and exposure geometry. In this context, it may be noted that the critical energies for the SRC and NSLS storage rings are 1.07 and 5.0 keV, respectively. Half of the integrated radiated power lies on either side of the 'critical energy', which is a characteristic of the storage ring parameters. FIG. 3 shows the calculated flux and spectral power for the two rings at their nominal operating conditions, obtained using conventional software for such calculations. It can clearly be seen that the higher energy NSLS ring produces a significantly harder X-ray spectrum, with much higher power overall. The differences between these two example sources which are of significance for hard X-ray lithographic applications may be best understood by considering resist exposures with these sources and subsequent processing.

Conventionally, the term "absorbed dose" or simply "dose" is defined as the amount of energy imparted by radiation such as X-rays to a unit mass of irradiated material. For convenience, in lithographic processing the term 'dose' is sometimes defined as the energy absorbed in the resist per unit area of the resist layer when the resist is in the form of a thin film. For the processing of large volumes of resist in arbitrary shapes, it is more appropriate to define dose as energy absorbed per unit resist volume. This last definition will generally be used herein. The situation is made more complex by the fact that, in practice, the absorption of energy by the resist results in a gradient of dose along the X-ray beam trajectory, which depends on the composition of the resist and the spectral profile of the X-ray beam. A requirement of a successful exposure is that all illuminated parts of the resist receive a sufficient dose to allow successful development of the image (referred to as the "threshold dose"), while not allowing any part to receive so great a dose as to cause damage to the resist, such as large bubbles, which would disrupt the unexposed portions of the resist.

X-ray transmission filters and photoresists may be assumed to modify the spectral photon distribution by the Bouguer-Lambert law:

$$N(h\nu) = N_o(h\nu) e^{-\alpha(h\nu)d} \tag{1}$$

where $N_o(h\nu)$ is the original spectral distribution, $\alpha(h\nu)$ is the filter's attenuation constant at photon energy $h\nu$, and $d$ is the filter's thickness. Total absorption cross-sections $\mu_z(h\upsilon)$ are commonly given for each element over a range of photon energy in units of cm²/atom. A filter's attenuation constant is then calculated as follows:

$$\alpha(h\nu) \left[ \frac{1}{cm} \right] = \frac{N_A \text{density}}{amu} \sum_2 \text{index}_Z \mu_Z(h\nu) \quad (2)$$

using the density and atomic mass unit (amu) of the filter material and sum of the weighted total absorption cross sections for each element making up the filter.

The physics of the attenuation caused by any particular filter is a well understood phenomena, and is easily calculable using widely available software for the purpose. See Chapman, et al., "PHOTON: A Program For Synchrotron Radiation Dose Calculations," Nuclear Instruments and Methods A, Vol. 266, 1988, pp. 191–194. Such computational tools were utilized to provide the graphs of FIGS. 4–12 to illustrate salient features of the invention. In these examples, polymethylmethacrylate (PMMA) is utilized as the resist, and the power deposited within 0.3 mm thick layers of a 3 mm total thickness resist is calculated. Data are presented both as a function of photon energy and as integrated power deposited as a function of depth for a variety of practical filter combinations.

Figure 4:
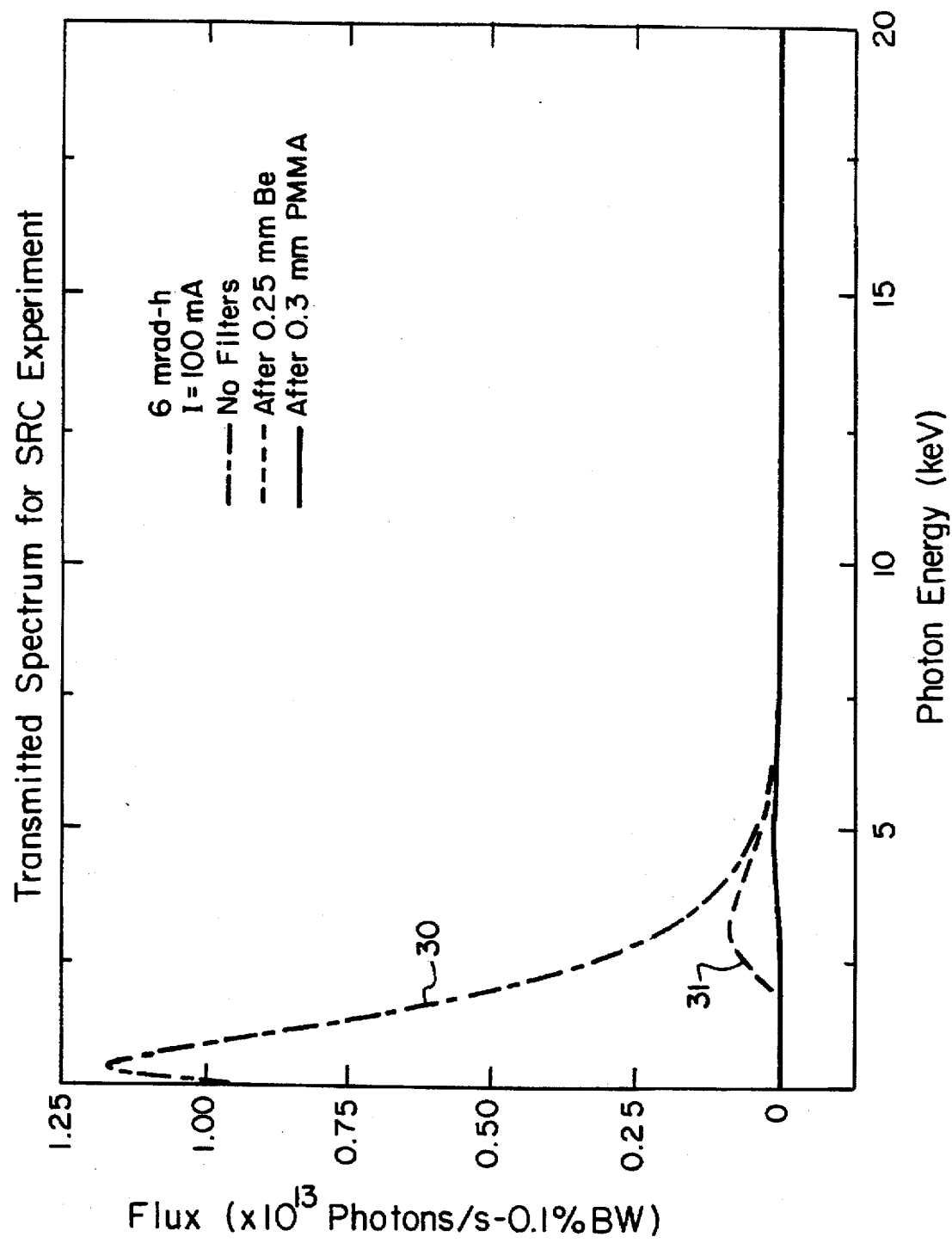
FIG. 4 are graphs showing the spectral power distribution for the SRC synchrotron before and after filtering.
Figure 5:
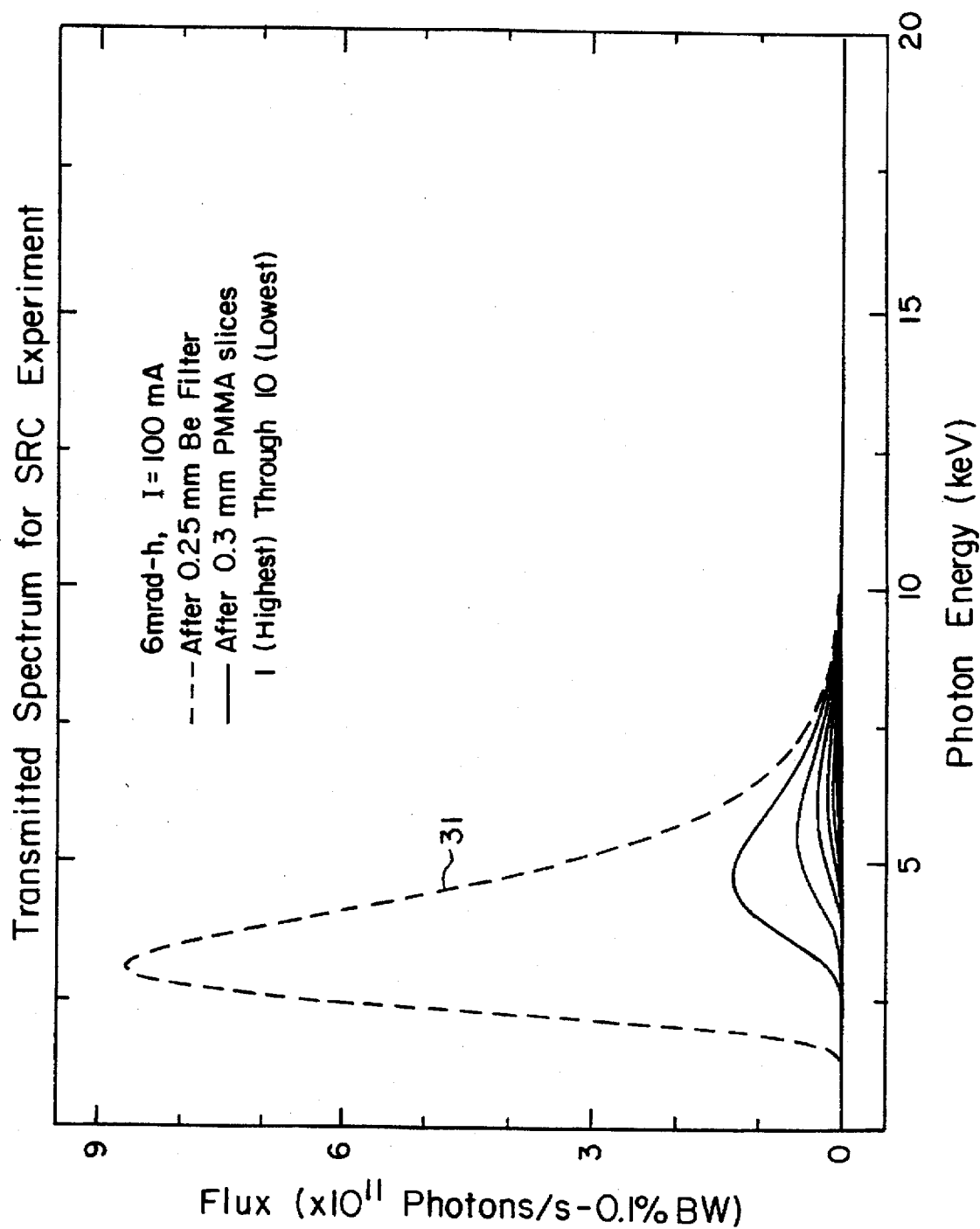
FIG. 5 are graphs showing the spectral power distribution for the SRC synchrotron after filtering and after passing through various thicknesses of photoresist.

FIG. 4 illustrates data for the SRC storage ring for flux as a function of photon energy. The upper curve 30 is the spectrum from the machine, while the next lower curve 31 is the radiation transmitted through a 0.25 mm thick beryllium filter. This latter curve 31 in FIG. 4 comprises the highest flux curve in FIG. 5, while the family of curves below the curve 31 in FIG. 5 illustrates the energy deposited in 0.3 mm thick layers of the photoresist starting from the entrance surface (the highest curve) to the exit surface (the lowest curve) of a 3 mm thick resist film. It should be noted that the peak energy in the absorption shifts significantly through the resist, and, more importantly, that the power absorbed in each simulated layer varies by orders of magnitude. The effect is shown clearly in FIG. 6, where both the power absorbed as a function of depth and the integrated power are shown against the same resist thickness scale. Essentially all the incident power is deposited in the first 0.5 mm of resist, while the power deposited near the exit surface is negligible. A sample with such a significant range of dose would generally be impossible to successfully process to its full 3 mm thickness. It should be noted, however, that more modest resist thickness, e.g., of up to 0.5 mm, can be successfully patterned at SRC. In practice, workable exposure times are on the order of hours for planar resists of 0.5 mm thickness at SRC.

Figure 6:
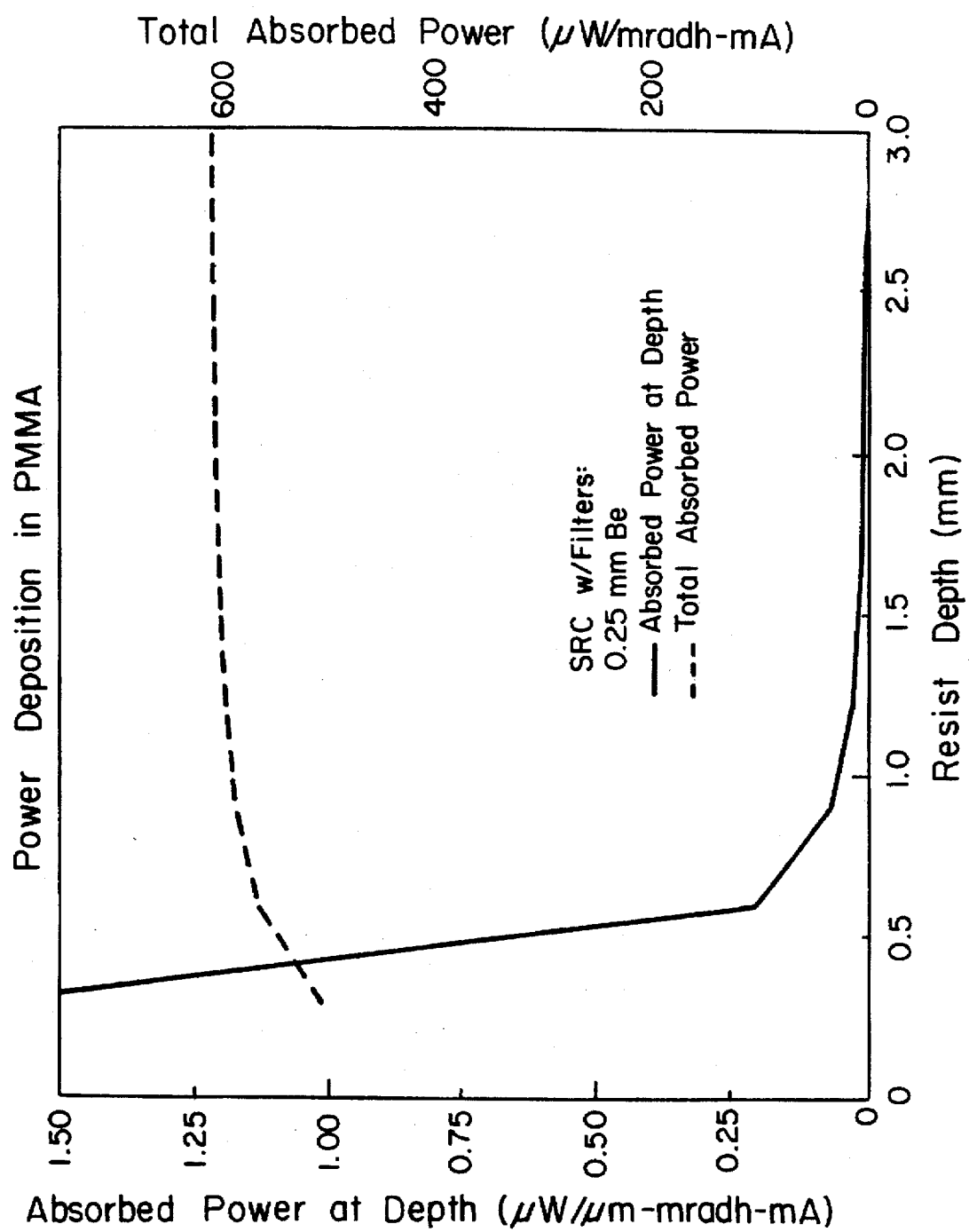
FIG. 6 are graphs showing the absorbed power as a function of resist depth for the SRC synchrotron.
Figure 7:
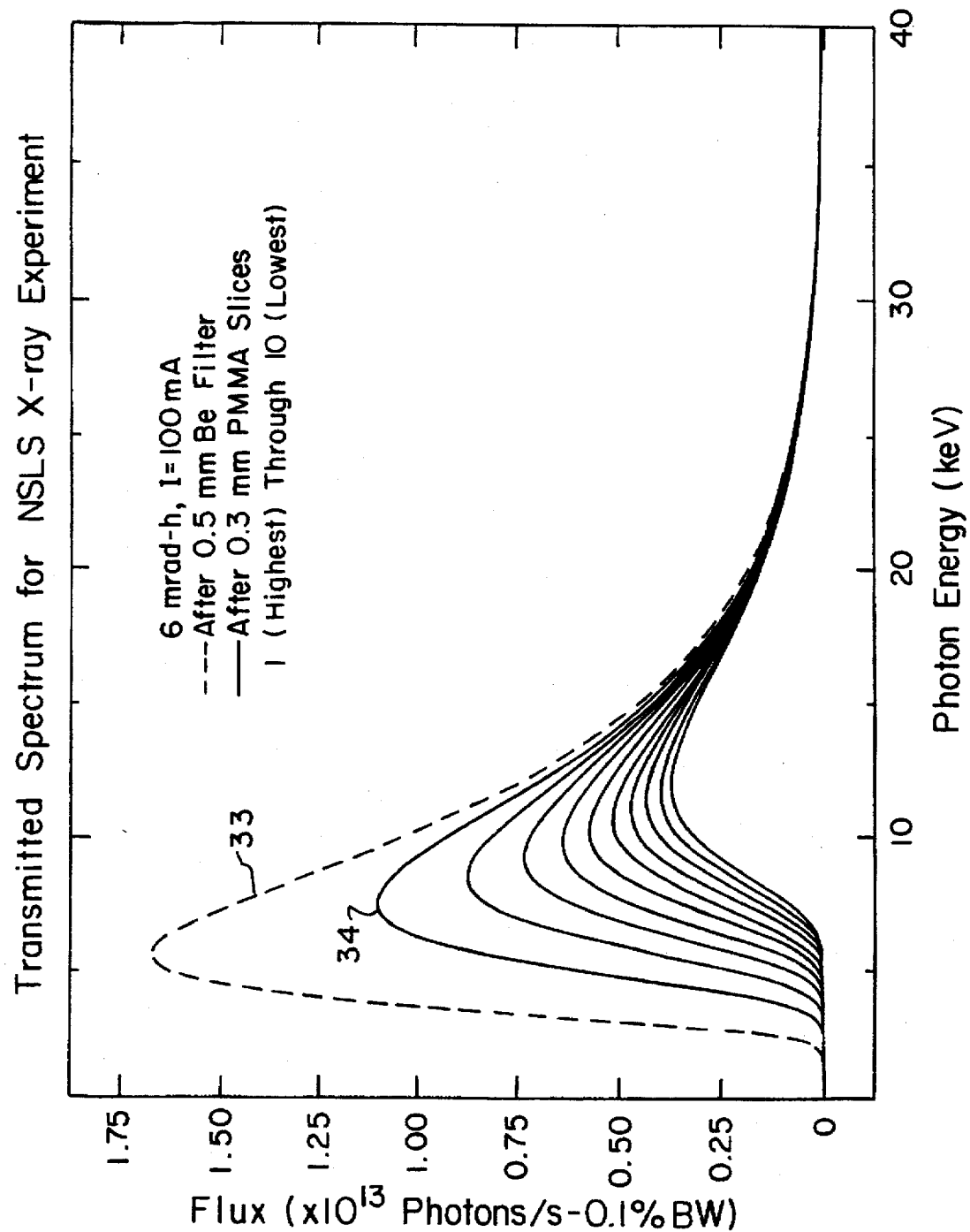
FIG. 7 are graphs showing the spectral power distribution after beryllium window filtering and at various photoresist depths for the NSLS synchrotron.
Figure 8:
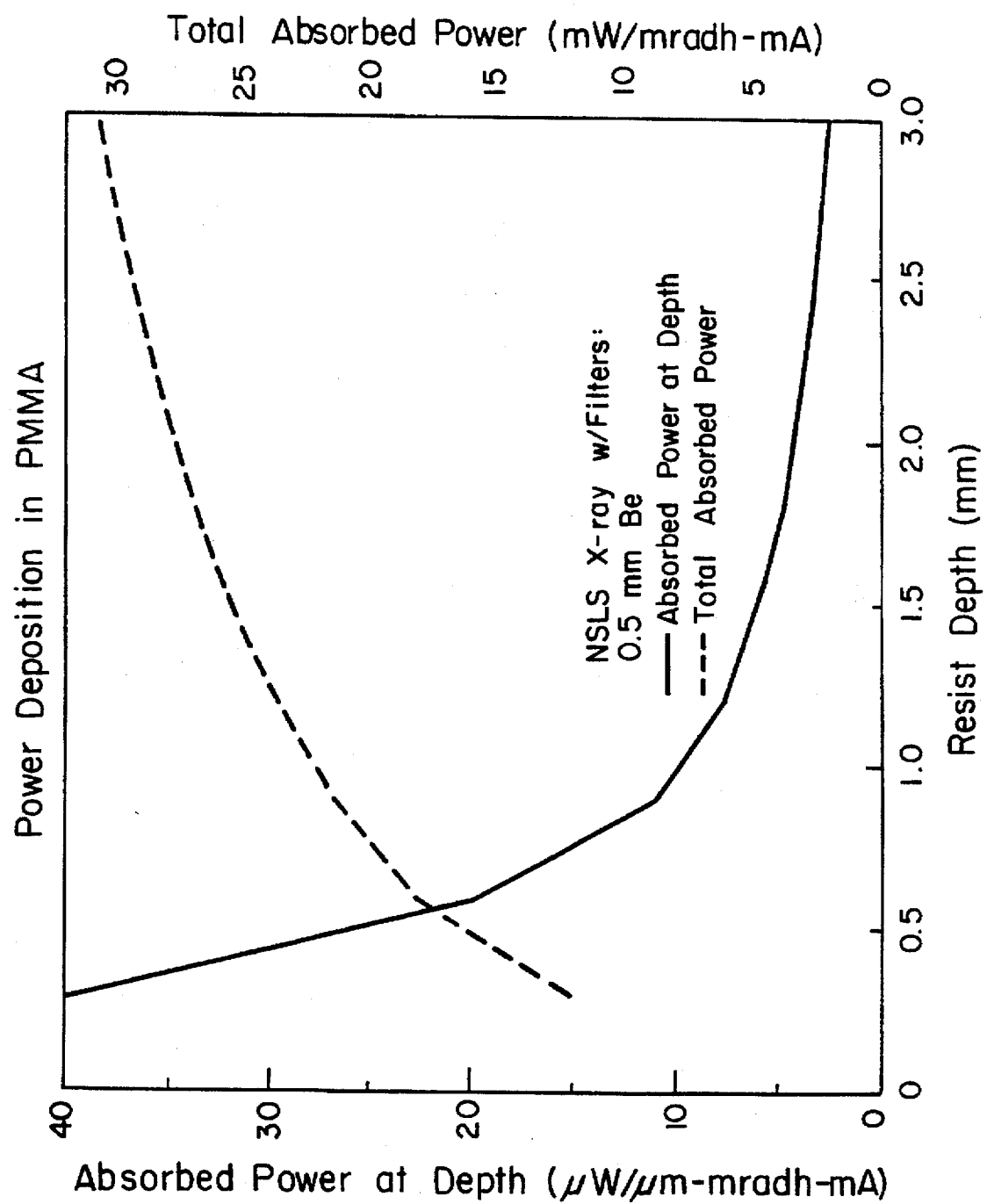
FIG. 8 are graphs showing the absorbed power as a function of resist depth for the NSLS synchrotron as filtered in FIG. 7.

When the NSLS X-ray ring is employed for an exposure utilizing only a 0.5 mm thick beryllium spectral filter, the resulting filtered spectrum curve 33 and the layer absorbed spectra curves are illustrated in FIG. 7, with the curve for the layer nearest the entrance surface shown at 34 in FIG. 7. The trend is similar to that shown in FIGS. 4 and 5, although the peak in the absorbed spectrum occurs at a somewhat higher photon energy, and the dose to the sample is more than two orders of magnitude higher than at SRC. The gradient through the photoresist, shown for the NSLS source in FIG. 8, is also similar to the profile of the SRC shown in FIG. 6, demonstrating an exponential decay in dose as a function of resist depth but with much greater absorbed energy at all depths. It is noted that a 3 mm resist film exposed to the NSLS beam of FIG. 6 is damaged catastrophically in less than 5 seconds. A sample of PMMA which is exposed in this manner typically has a boundary of very fine foam glass at the surviving margins of the exposure. The absorbed power for this sample under practical conditions is only a few watts. The damage to the sample may result from a competition between the rate at which low molecular weight photofragments of the resist are created, and the rate at which they leave the exposed region either by volatilization or dissolution into the unexposed resist material. For the example just described, the rate of production of volatile components far outstrips the transport rate of material from the exposed area. Bubbles and voids form in the exposure zone which introduce sufficient mechanical strain to damage the portions of the resist which are not intended to be exposed. Because of the exponential decay of absorbed energy with depth, it is apparent that damaging dose levels will be reached first at portions of the photoresist near the entrance surface.

Although direct heating of the photoresist may not be responsible for the failure mode described above, photo-induced heating can be important for resist films bonded to a substrate. Where the resist film is supported by a substrate with a higher average atomic number than the resist itself, local heating at the interface can be significant, and can cause failure of the bonding, or introduce distortions in the resist film through thermal expansion differences between the substrate and the resist. These effects can significantly degrade the precision and quality of parts subsequently manufactured from the processed resist. Formation of voids in the resist film can occur at total doses well below those required to drive the film to catastrophic failure, although their impact on the final product can be just as deleterious.

In the present invention, appropriate spectral filtering is utilized to provide an X-ray beam which is capable of providing a threshold dose to the exit surface of the resist before the portions of the resist at the entrance surface receive a dose sufficient to damage the integrity of the resist.

Figure 9:
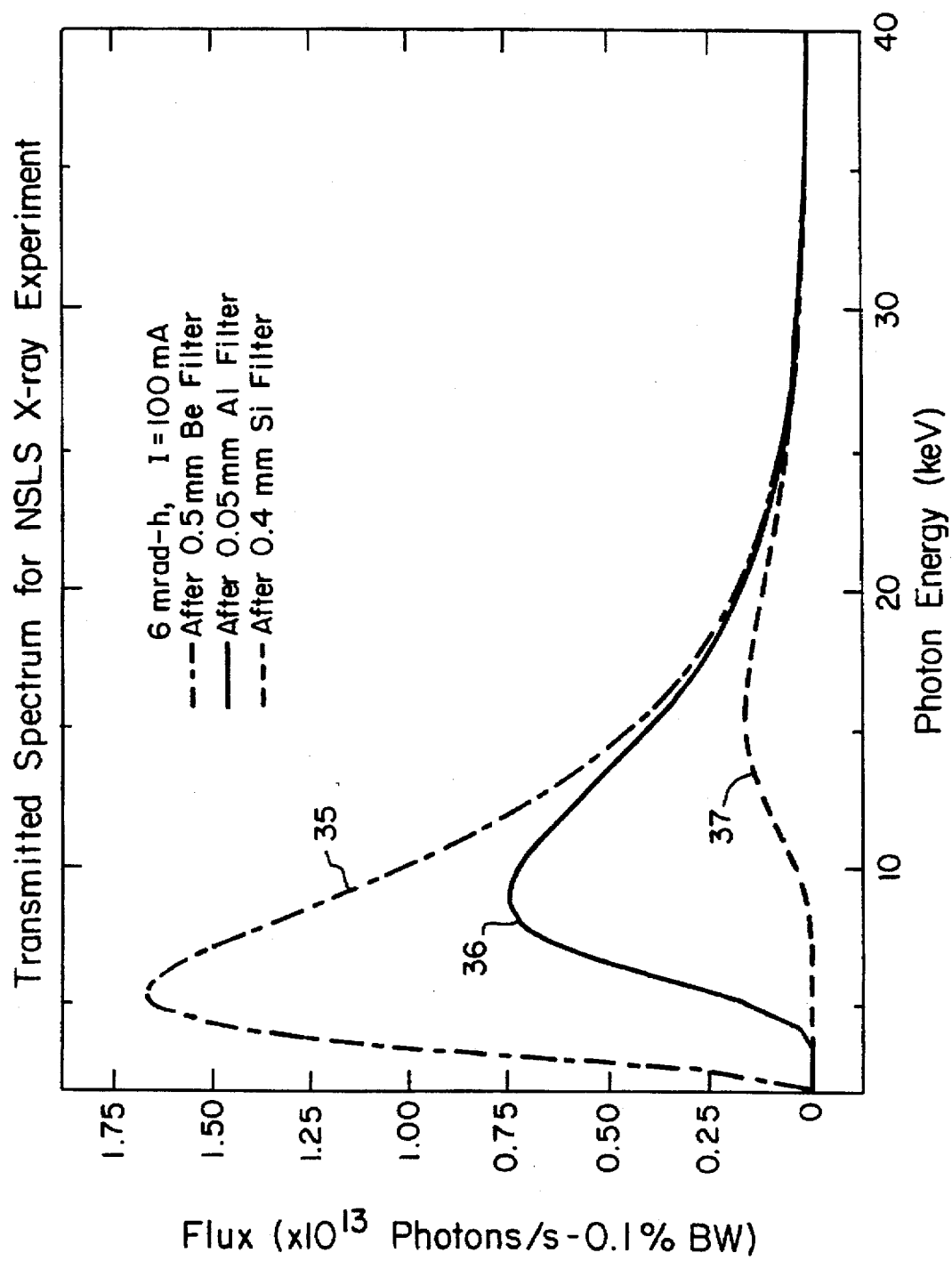
FIG. 9 are graphs showing the spectra of the NSLS synchrotron with various selected filters inserted in the beam path.
Figure 10:
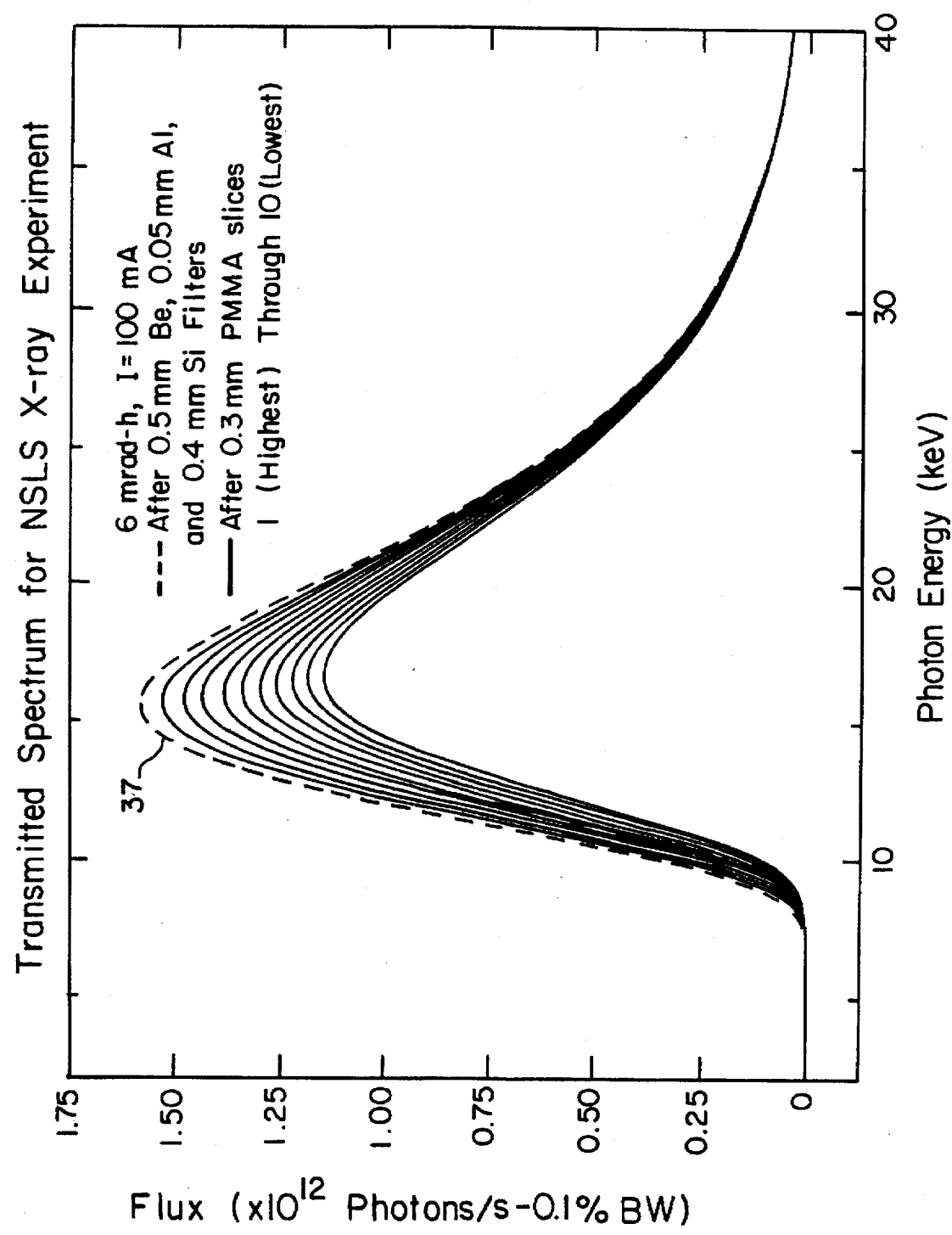
FIG. 10 are graphs showing the power spectra of the NSLS synchrotron after filtering with all of the filters as in FIG. 9 and at various depths of photoresist.
Figure 11:
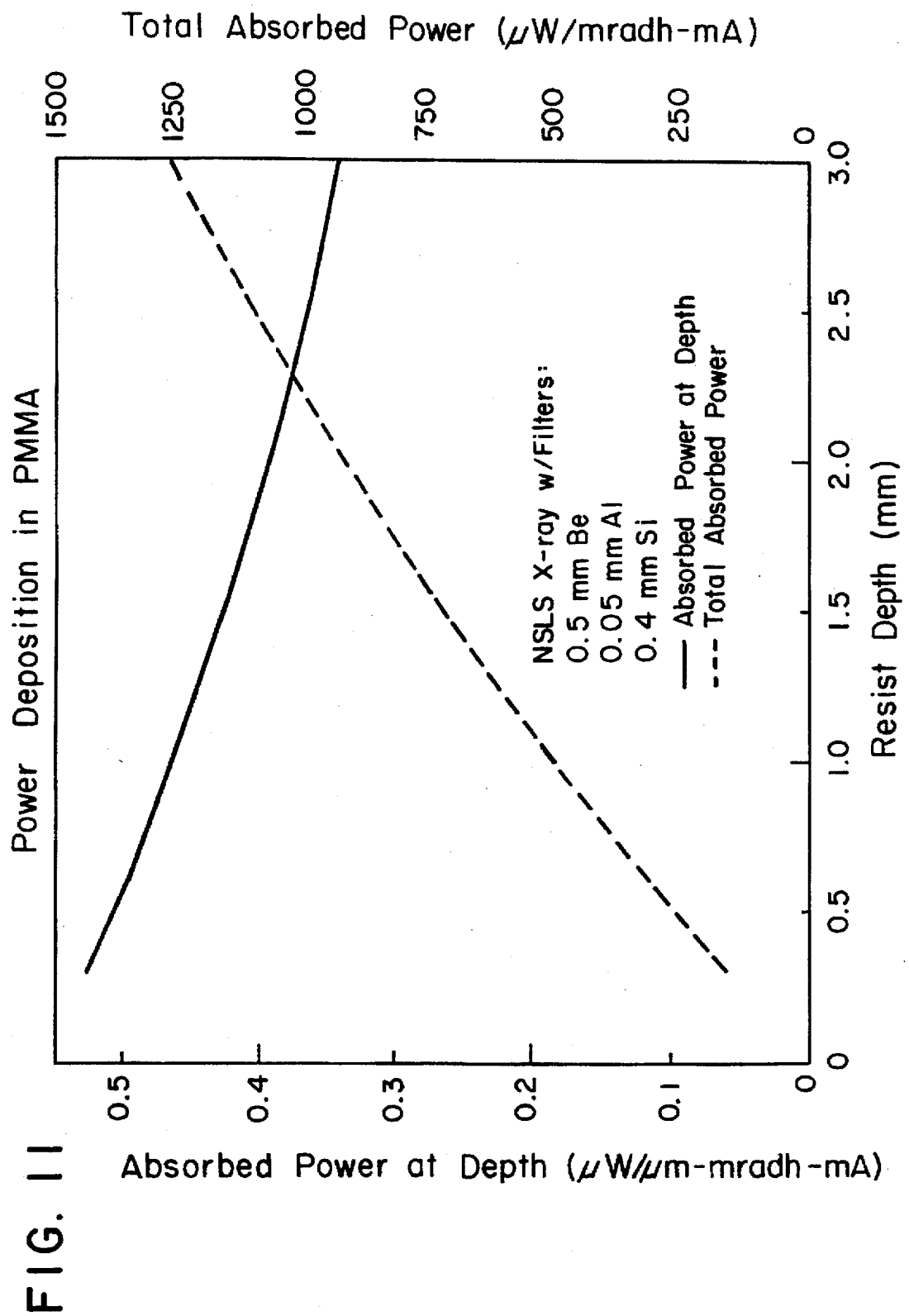
FIG. 11 are graphs showing the absorbed power as a function of resist depth for the NSLS synchrotron as filtered for the graphs of FIG. 10.
Figure 12:
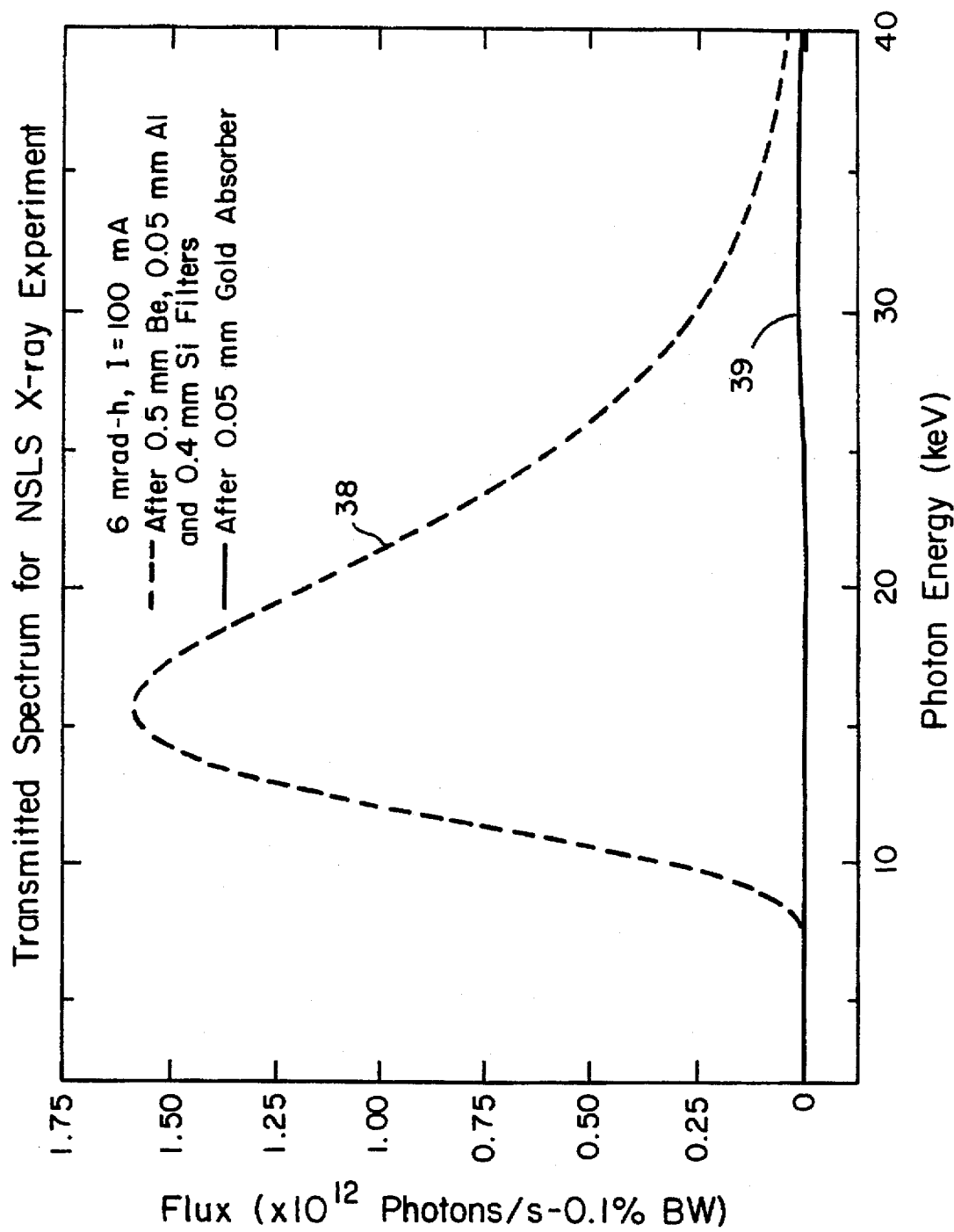
FIG. 12 are graphs showing the spectra for the NSLS synchrotron after filtering as in FIG. 10 and after passing through 50 μm of gold absorber.
Figure 20:
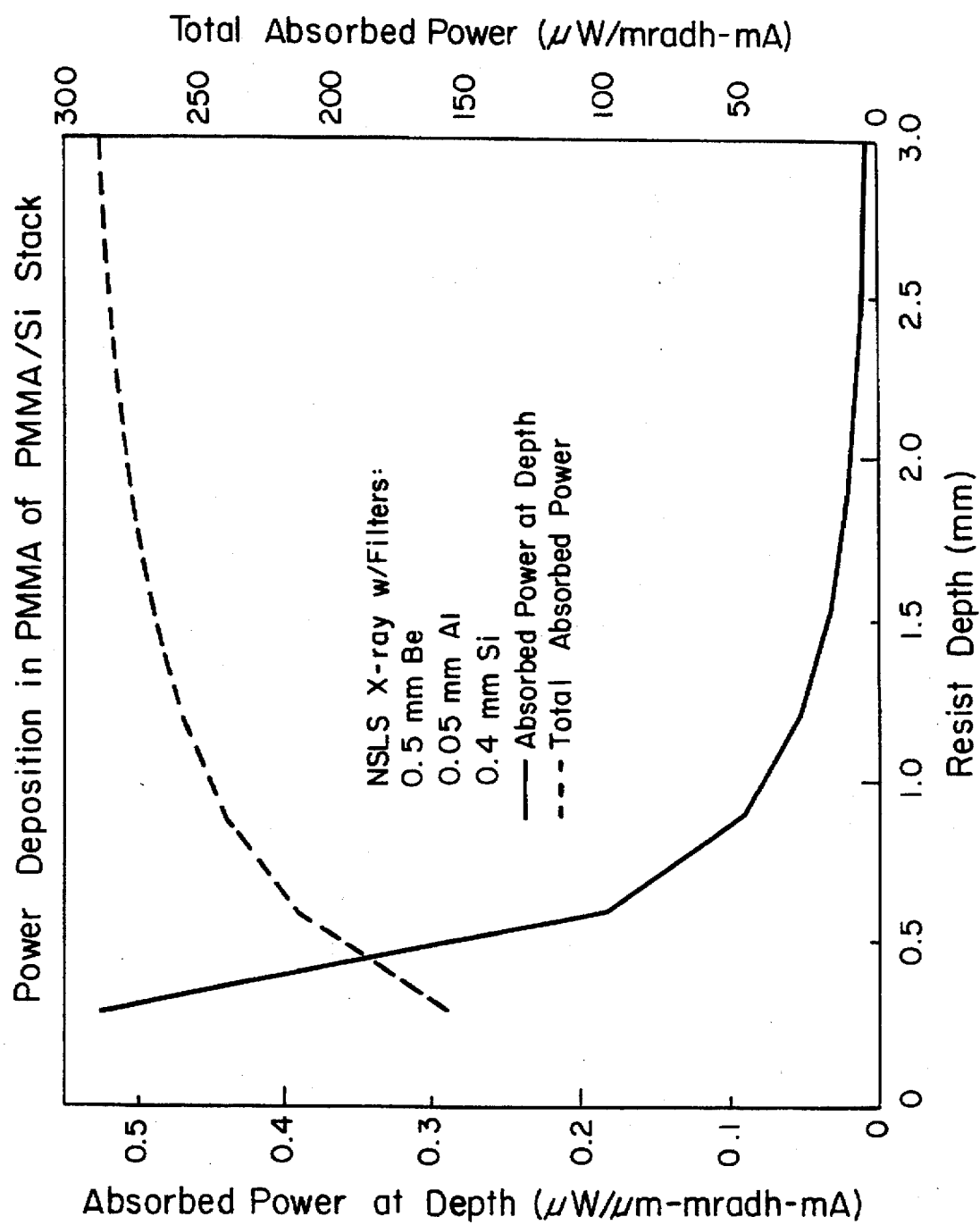
FIG. 20 are graphs showing the absorbed power as a function of resist depth (number of layers) for a multiple layer exposure using silicon substrates.
Figure 21:
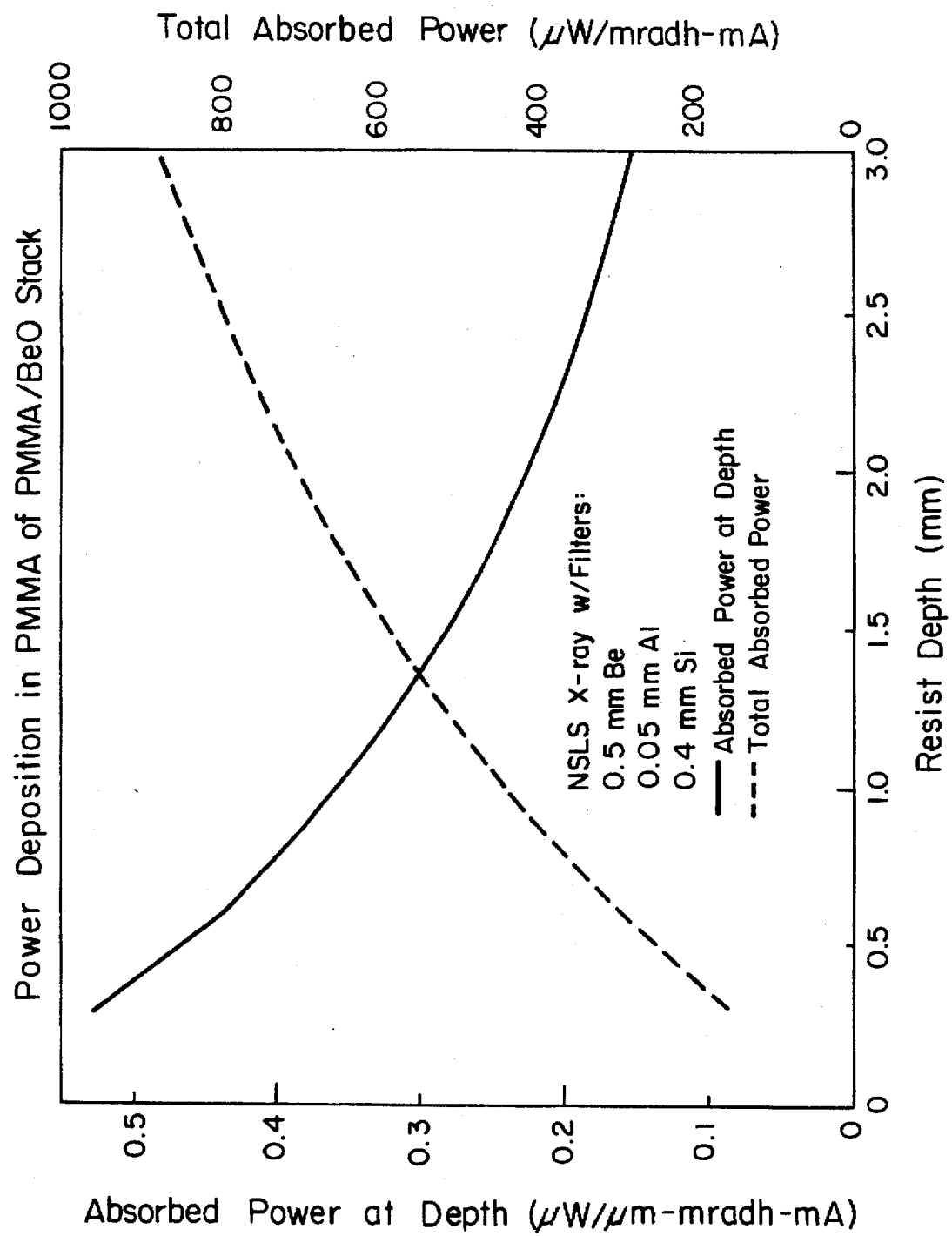
FIG. 21 are graphs showing the absorbed power as a function of resist depth (number of layers) for a multiple layer exposure using beryllium oxide substrates.

For example, the NSLS beam characterized by the curve 33 in FIG. 7 may be further filtered using filters comprised of 0.05 mm of aluminum and 0.4 mm of silicon. The silicon filter may comprise the mask support substrate, which results in a very robust mask structure. FIG. 9 illustrates the spectral distribution of the NSLS beam after the beryllium filter, curve 35, the aluminum filter, curve 36, and the silicon filter, curve 37. FIG. 10 illustrates curves showing the energy deposited in each layer of the resist by the fully filtered beam. Note that as the fully filtered beam passes from entrance surface to exit surface in 3 mm of resist, the dose varies by less than 30%, as contrasted with several orders of magnitude of variation shown in FIGS. 5 and 7. FIG. 10 also shows that the peak in the spectrum shifts by only a comparatively small amount through the resist. FIG. 11 illustrates the absorbed power gradient for this filtered beam, and a nearly linear variation of dose through the entire 3 mm thick resist film is quite clear. A resist film exposed with such small variations in depth dependent dose is much more easily processed in a planar geometry, and the filtered beam allows fully figured exposure geometries which will be described below. It is seen from FIG. 9 that the spectrum 37 of the final filtered beam contains photon energies substantially only above 10 KeV, which is preferred in accordance with the present invention, although for some resist exposures, a beam with photon energies greater than about 5 KeV may be used. As discussed above and illustrated in FIG. 2, several photoresist targets, each supported by a substrate, may be exposed simultaneously. FIG. 20 shows computed absorbed power in stacked and simultaneously exposed. Each layer is formed of a 0.4 mm thick silicon wafer substrate supporting 0.3 mm thick PMMA photoresist. The resist depth corresponds to each of the photoresist layers, i.e., at 0.3 mm, 0.6 mm, 0.9 mm, etc. If desired, the ratio of absorbed power in the first layer and the last layer can be reduced by using only a silicon substrate as the first layer, which effectively functions as an additional filter. A similar plot is shown in FIG. 21 for a stack in which 0.3 mm thick photoresist is supported by 0.25 mm beryllium oxide wafers. Because the decay is more gradual with such substrates, even more than ten layers may be exposed in a stack simultaneously, if desired.

Figure 13:
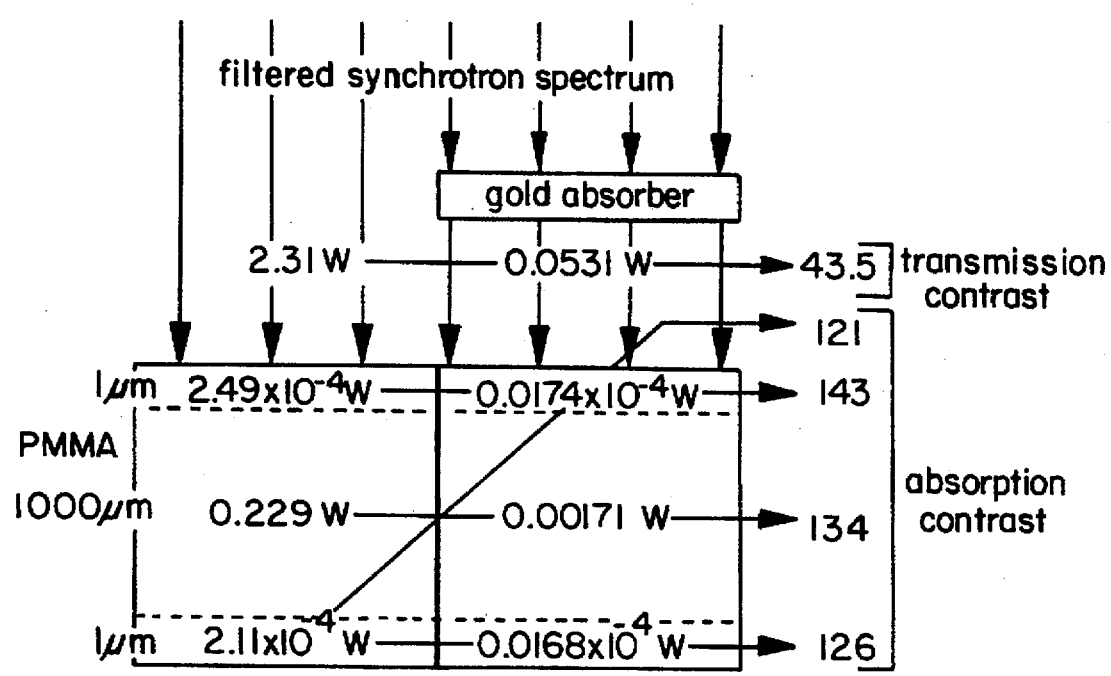
FIG. 13 is a schematic view illustrating the contrast for an example X-ray mask using the NSLS synchrotron for an exposure of 1000 μm of PMMA.

To achieve a figured resist film, however, a suitable mask must be available. The short wavelength of the X-rays and collimation of the source used make it possible to use macroscopically thick, self supporting materials as a mask. These include conventionally machined self supporting pieces of various high atomic weight materials including copper, tungsten, molybdenum, tantalum, and lead as masks where the precision of the mask is not an issue. For a practical, high tolerance, high precision mask system, particularly where feature sizes may be significantly less than one mm, a lithographically produced mask is highly desirable. Such masks have been successfully produced utilizing 50 µm thick gold patterns deposited on a silicon wafer by conventional LIGA techniques. The relative transmission of the NSLS filtered beam and the same beam with the addition of a 50 µm gold absorber film are shown in the curves labeled 38 and 39, respectively, in FIG. 12. Calculations show that the gold produces a 98% attenuation in the integrated transmitted spectrum, suggesting that much thinner films of gold, or masks fabricated with other materials would be suitable for the mask absorber. FIG. 13 graphically illustrates the exposure contrast which can be achieved with this mask system.

The photoresist and the developer chosen to develop it determine the amount of energy required to expose the photoresist (the threshold dose), the maximum power the photoresist can receive, and how the incoming photon spectrum changes as it passes through a thick photoresist. The threshold dose of a photoresist describes the amount of energy required for the photoresist to dissolve in a specific developer, and thus is a function of photoresist type and the developer used. For thick photoresists, the bottom or exit surface of the photoresist must receive this threshold dose for the photoresist to develop all the way through. 1.6 $KJ/cm^3$ is typically considered as the exposure threshold dose to expose PMMA, but a threshold near 2.0 $KJ/cm^3$ is commonly used to ensure complete exposure. Given knowledge of the synchrotron ring parameters and the photoresist, the exposure time can be calculated as a function of photoresist thickness.

The maximum power limit for a thick photoresist determines the amount of power the portions of the photoresist closest to the photon source (i.e., at and near the entrance surface) can absorb while the portions of the photoresist farthest away (i.e., at the exit surface) receive at least the exposure threshold dose.

The photoresist is preferably carefully prepared prior to exposure to remove any excess monomer and water through heat and vacuum cycles prior to exposure. As noted above, it is also possible to maintain selectively elevated photoresist temperatures during exposure (for example, 35° C. to 45° C. for PMMA) to increase the diffusion rate of any volatile species produced during the breaking of bonds. This allows an increase in the power deliverable to the photoresist, and thus reduces exposure times. Thus, it may be desirable to heat the photoresist above ambient but to a controlled temperature which is not so high as to result in detrimental thermal heating effects.

The design of the X-ray filter must take into account the total photon spectral distribution available from the exposure source and the photoresist maximum power limit and exposure threshold dose. The filter design preferably tailors the available photon spectral distribution to allow the photoresist to be exposed in the shortest amount of time while staying within the photoresist power limit. An appropriate filter will allow the photoresist entrance surface to receive at or near the power limit while maximizing the power delivered to the bottom-most photoresist layers so that it reaches or exceeds the exposure threshold dose as quickly as possible.

Grazing incidence mirrors may also be placed into the beamline to tailor the synchrotron's photon spectrum and may be considered filters in accordance with the invention. The mirror angle acts as a low pass filter (high energy photons pass through and are not used while low energy photons reflect off to the sample) with a cut-off photon energy determined by the mirror angle. Mirrors are useful because high energy photons which would have otherwise passed through the photoresist and heated the backing substrate are removed. Unfortunately, mirrors also have some limitations. Mirrors inserted into a beamline are difficult to remove and thus limit the photon spectrum available for tailoring. A mirror in a beamline sets the maximum photoresist depth and, for a mirror to prevent substrate heating, it also sets the minimum photoresist thickness. It is noted that transmission filters formed of material through which the beam is transmitted can be added at any time in a beamline, while a mirror change may require a new beamline design. Thus, transmission filters are preferred over mirror filters for spectrum tailoring unless a beamline is specialized to a specific photoresist thickness.

As noted, filters are used in the present invention to both reduce the X-ray beam power and shift higher in photon energy the spectrum delivered to the photoresist. Transmission filters made of relatively high absorption length or low atomic number material may be added first as required until they become unreasonably thick, and then higher atomic number filters can be used. Common filter materials include beryllium for the low atomic number and silicon and/or aluminum for the higher atomic number materials. Silicon is ideal as a filter because it allows an increase in the thickness of the membrane commonly used as the substrate for the X-ray mask. The thicker the X-ray mask membrane, the cheaper, more durable, and simpler will be the resulting X-ray masks.

The X-ray mask prevents specific areas of the photoresist from reaching the exposure threshold. X-ray masks use a thick patterned film of short absorption length X-ray absorbing materials on a thin film or membrane of a long absorption length X-ray transparent material. Common absorbers are gold, tungsten, tantalum, tungsten-titanium, nickel, and copper. Common membrane materials are thin free standing films of pure and doped carbon, silicon, and silicon nitride.

The contrast of an X-ray mask measures its quality; i.e., how well the absorber blocks areas of the incoming spectra while allowing other parts of the spectra to pass through the membrane. Two types of X-ray mask contrasts can be defined: (1) a transmission contrast which defines the ratio of the total power transmitted through the membrane alone to the total power transmitted through both the absorber and membrane; and (2) an absorption contrast which is the ratio of the power absorbed in the photoresist in the areas exposed through the membrane alone to the power absorbed in those areas protected by both the absorber and membrane. Both contrasts depend on the incoming spectrum, but only the absorption contrast includes the absorption function of the photoresist. For an X-ray mask to be effective, it must block enough power from being absorbed in the photoresist under the absorber for it not to be removed by the photoresist developer, while allowing the power absorbed in the other areas to reach the exposure threshold. Therefore, only the absorption contrast need be used to measure the quality of an X-ray mask for such photoresist exposures.

Exposure dose thresholds may conveniently be specified in energy per unit volume, and the power used in the X-ray mask contrast ratio must be a power density. Because the power absorbed per photoresist volume is a function of photoresist depth, an absorption contrast must specify the depth at which the power density is measured. The power density absorbed in the photoresist from X-rays passed through the mask membrane alone measures the quality of the membrane to allow exposure of the photoresist. For this reason, it is preferable to measure the power absorbed at the bottom of the photoresist in the areas of exposure. The denominator of the X-ray mask absorption contrast measures the quality of the absorber in preventing the photoresist beneath it from being exposed. Therefore, it is preferable to measure the power absorbed at the upper surface of the photoresist protected by the absorber. Actually, in most cases the absorption length of the photon spectrum filtered by the absorber is so long that the power density absorbed is the same at all depths in the photoresist in the protected regions. In summary, the absorption contrast of an X-ray mask for a photoresist of thickness d may be defined as the ratio of the power density absorbed at a depth d in the photoresist under the membrane to the power density absorbed at the entrance surface of the photoresist under the absorber.

$$\text{Absorption\_Contrast}(d) = \frac{P_{abs,membrane}(d)}{P_{abs,absorber}(\text{surface})}$$

Absorption contrasts of 2 to 400 are common in deep X-ray lithography. The necessary absorption contrast depends on the developer used and the desired run-out on the sidewalls of the developed photoresist structures. The greater the selectivity of the developer, the smaller the X-ray mask absorption contrast can be. The greater the contrast, the more vertical the sidewalls of the photoresist structures will be after development.

An example of an X-ray mask at NSLS for 1000 μm PMMA exposures consists of a 50 μm thick gold absorber patterned on a 400 μm thick silicon wafer. This X-ray mask requires the use of a synchrotron to pattern. The 50 μm of gold is patterned with a 50 μm to 60 μm deep X-ray LIGA exposure. The first X-ray mask used to expose the final mask is either a high contrast, thin gold, thin membrane X-ray mask in a lower energy synchrotron, or a low contrast, thin gold, thick membrane X-ray mask in a high energy synchrotron. The absorption contrast for 1000 microns of PMMA for the final X-ray mask at NSLS is near 45. FIG. 13 shows various measures of the contrast of the incoming and outgoing spectra for this mask. The absorption contrasts measured at the surface, bulk, and bottom of the PMMA are nearly the same because the absorption length of the filtered spectrum of the NSLS synchrotron is near 1000 μm.

Figure 14:
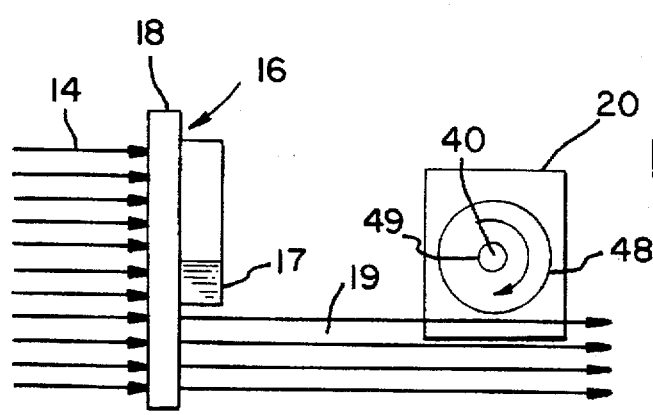
FIG. 14 is a simplified elevation view of a photoresist target being rotated in the patterned beam passed through an X-ray mask.
Figure 15:
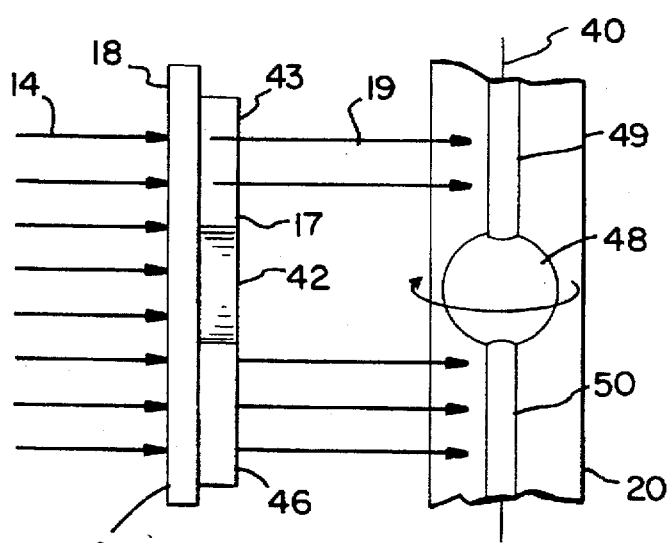
FIG. 15 is a top view of the rotated photoresist sample as shown in FIG. 14.
Figure 16:
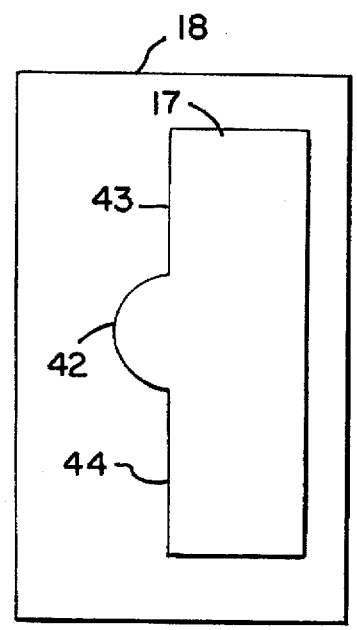
FIG. 16 is an end view of the pattern of absorber on the X-ray mask for the exposure illustrated in FIGS. 14 and 15.

The spectrally shaped X-ray beam available in accordance with the present invention allows dynamic exposure of photoresist targets as well as the essentially stationary exposure exemplified by the fixture shown in FIG. 1. A first example is shown in FIGS. 14–16. Here the target 20 is mounted for rotation around an axis 40 which is aligned horizontally in the plane of the beam to minimize scanning field and exposure time. The axis 40 is also aligned parallel to the plane of the mask substrate. The X-ray mask 16 has an absorber pattern 17 thereon which is formed as shown in FIG. 16, having a half circular central portion 42 and top and bottom extensions 43 and 44. The X-ray beam 14 which passes through the mask 16 is shaped by the absorber 17 shown in FIG. 16 and, as the target 20 is rotated (e.g., in small discrete steps, or continuously where appropriate) about the axis 40, the portions of the photoresist which are not exposed to a threshold dose define a solid of revolution around the central axis which includes a central ball portion 48 corresponding to the half circular portion 42 of the absorber and two end sections 49 and 50 corresponding to the end sections 43 and 44 of the absorber. When the exposed target is developed by immersion in a developer (e.g., MIBK), the solid of revolution of FIG. 15 of unexposed photoresist will remain. It is apparent that any solid of revolution can be formed in this manner, effectively using the incoming X-ray beam in the manner of a lathe to define the shape of the solid of revolution.

Figure 17:
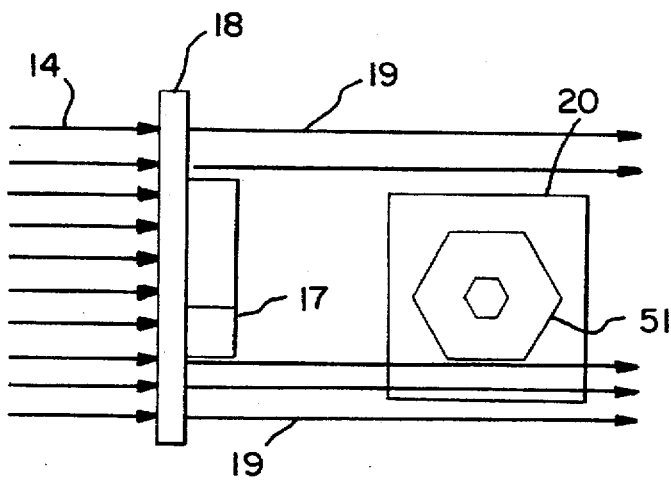
FIG. 17 is an elevation view of another exposure of a rotated photoresist in which the photoresist is rotated in relatively large discrete steps.

In addition to continuous or semicontinuous rotation of the target 20 about a central axis, the target may also be rotated in larger discrete steps. The result of such rotation is illustrated in FIG. 17, in which the X-ray absorber 17 has a simple pattern of an elongated rectangle, with the short side of the rectangle being shown in FIG. 17. The target 20 is rotated 60° between each exposure. The result is a hexagonal shaped portion 51 which receives less than a threshold dose and which will remain when a developer is applied to remove the more heavily dosed portions of the photoresist that lie outside the shaped portion. It is apparent that other polygonal cross-sections for the shaped structure may be formed in this manner.

Figure 18:
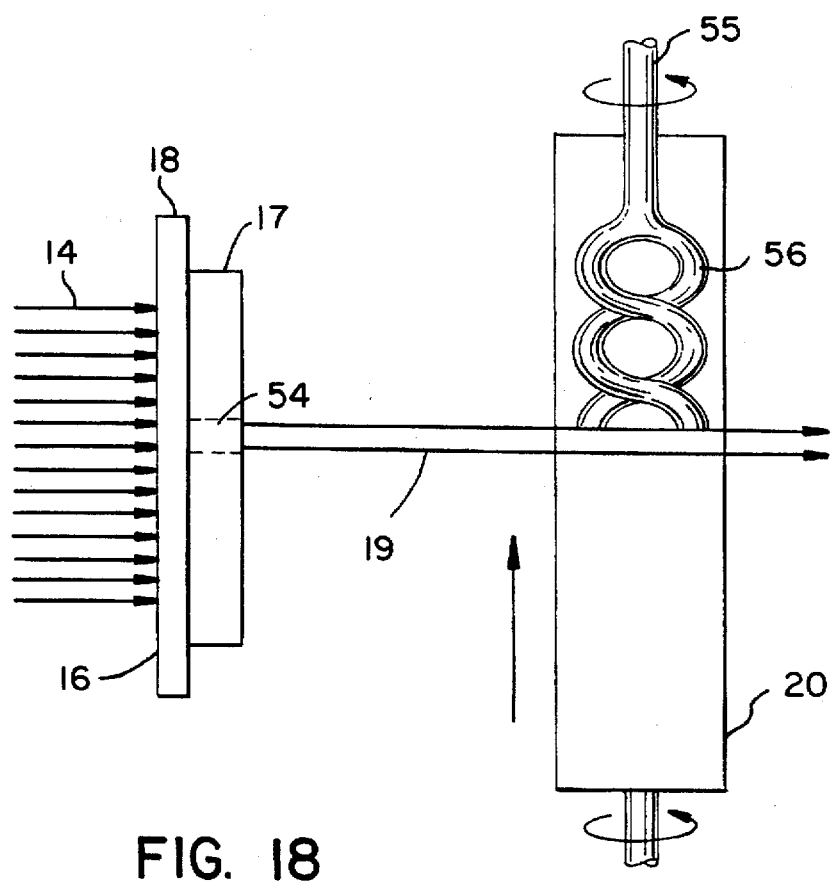
FIG. 18 is a simplified top view of a photoresist which is both rotated and translated in a narrowly defined beam passed through an opening in an X-ray mask.

FIG. 18 illustrates the manner in which a narrow, well defined beam of X-rays may be used to machine complex configurations into the photoresist target. In this case, the absorber 17 is patterned so that it has a single hole 54 formed in it through which a thin portion of the beam 14 passes. This thin portion can then be used to expose comparable thin portions of the photoresist 20, which may be rotated around a central axis of rotation 55. An exemplary structure which may be formed in this manner is the screw shaped structure 56 as shown in FIG. 18. Stepped rotation of the target may also be utilized. The target may also be translated in two dimensions to draw an exposed line in the target.

Figure 19:
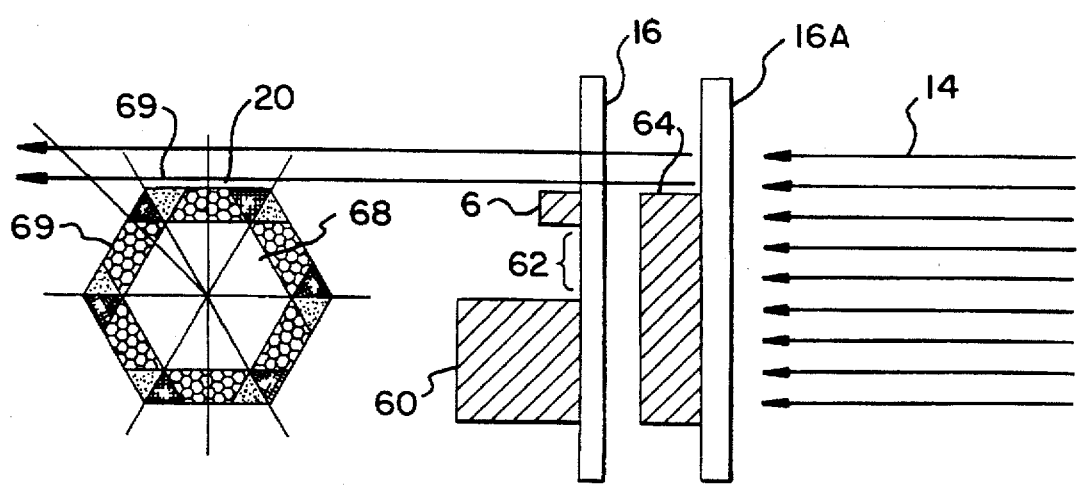
FIG. 19 is a schematic side view of an exposure of a photoresist target which is rotated in discrete steps and in which an interior portion of the photoresist adjacent the axis of rotation receives a cumulative exposure which exceeds the threshold dose while peripheral portions of the photoresist receive less than the threshold dose.

Reentrant structures may also be formed in accordance with the present invention. An example of such formation is illustrated in FIG. 19 in which two masks 16 and 16a are utilized. The mask 16 has a pattern of absorber 17 which includes a relatively thick center mask section 60 and a thinner rim mask section 61. An open space 62 is defined between them. A body mask 16a having a large rectangular absorber 64, similar to the rectangular absorber 17 of FIG. 17, can be inserted in position to partially block the beam 14. First, the outside shape is defined using the mask 16a. The target 20 is rotated in discrete steps, similarly to the target in FIG. 17, with six steps shown to define a hexagonal periphery. When the mask 16a is removed and an exposure made, the open area 62 between the absorber sections 60 and 61 will result in a central portion 68 of the target receiving a greater dose than the peripheral portions of the target which are shielded by the rim absorber section 61. By rotating the target in steps and allowing the exposure to proceed to the point where the central portion 68 receives a dose greater than the threshold dose, while the peripheral sections 69 which are shielded by the rim section 61 do not, when the target 20 is developed with a developer the central portion 68 will be removed, leaving a cavity in the photoresist. It is seen that the central portions of the target would be in the beam three times during each turn while the peripheral portions 69 would experience the beam only twice. It is noted that the masks 16 and 16A in FIG. 18, or the masks of FIGS. 14–17, do not necessarily require mask support substrates. The mask absorber materials shown may be mounted for self support in the beam, with openings defined between the absorber sections.

After development of the exposed photoresist targets, the targets may be used directly where such parts are needed. Moreover, the micromachined photoresist may be utilized as core sections for molds for molding additional plastic parts which will then take the shape of the micromachined part, and by suitably securing the photoresist structure to a plating base, plating of metal around and between such photoresist structures may be accomplished to build up metal structures which assume the shape of the photoresist. The photoresist may then be dissolved in a developer to leave the metal structures which have the reverse shape of the photoresist. Suitable developing and metal plating procedures are described in U.S. Pat. Nos. 5,189,777, 5,190,637, 5,206,983, and 5,378,583, the disclosures of which are incorporated herein by reference. Exemplary injection molding using metal microstructures is described in P. Hagmann and W. Ehrfeld, "Fabrication of Microstructures of Extreme Structural Heights by Reaction Injection Molding," International Polymer Processing IV, Vol. 3, 1989, pp. 188–195, incorporated by reference. The shaped electroplated metal may be used as a mold and liquid polymer applied to the mold to fill the mold, which is cured so that the polymer assumes the shape of the metal mold, and then after the polymer is cured, cured polymer is removed from the metal mold with the polymer having the shape of the metal mold.

It is understood that the invention is not confined to the particular embodiments set forth herein as illustrative, but embraces such modified forms thereof as come within the scope of the following claims.

What is claimed is:

1. A method for use in the making of precision micromachined parts having three-dimensional features comprising the steps of:
    (a) supporting an X-ray photoresist target object with respect to an X-ray mask having a pattern of X-ray absorbing material such that the X-ray target can be moved without interference from the mask;
    (b) passing a collimated X-ray beam from an X-ray source through the X-ray mask without substantial diffraction of the X-rays passed through the mask to expose the X-ray photoresist target object to the X-ray beam passed through the mask in one position of the target object, and selectively moving the X-ray photoresist target object including at least rotating the target object so that the target object is in a changed position and passing the X-ray beam through the X-ray mask to expose the target object in its changed position such that the total X-ray exposure in some portion of the target object exceeds the threshold dose for development of the exposed photoresist by a developer and such that some other portion of the photoresist receives a dose which is less than the threshold dose during an exposure in the one position of the photoresist and receives no dose in the moved position of the photoresist such that said other portion of the photoresist only receives a total dose which is less than the threshold dose.

2. The method of claim 1 including the step of applying a developer to the exposed target object to remove the portions of the target object which had been rendered susceptible to the developer to leave a completed micromachined object.

3. The method of claim 1 wherein the photoresist target is formed of PMMA.

4. A method for use in the making of precision micromachined parts having three-dimensional features comprising the steps of:
    (a) supporting an X-ray photoresist target object with respect to an X-ray mask having a pattern of X-ray absorbing material such that the X-ray target can be rotated without interference from the mask, wherein the X-ray mask has a planar substrate with a pattern of X-ray absorber formed on a surface of the substrate;
    (b) passing a collimated X-ray beam from an X-ray source through the X-ray mask without substantial diffraction of the X-rays passed through the mask to expose the X-ray photoresist target object to the X-ray beam passed through the mask, rotating the X-ray photoresist target object to change its orientation with respect to the X-ray mask wherein the target object is mounted for rotation about an axis which is parallel to the plane of the substrate of the X-ray mask, and passing the X-ray beam through the X-ray mask to expose the target object in its changed orientation such that the total X-ray exposure in some portion of the target object exceeds the threshold dose for development of the exposed photoresist by a developer.

5. The method of claim 4 wherein the X-ray mask is formed with an absorber pattern thereon which always shields a portion of the photoresist target from X-rays as the target is rotated.

6. The method of claim 5 wherein the target is substantially continuously rotated while the X-ray beam is passed through the X-ray mask to impinge on the target for a period of time sufficient to exceed the threshold dose for portions of the photoresist target which are not shielded.

7. The method of claim 5 wherein the photoresist target is rotated in steps, such that the target is rotated a selected fraction of 360° in one step, dwells at a position for a period of time sufficient to expose a portion of the photoresist target by the X-ray beam to a level above the exposure threshold dose, and is then rotated in at least one additional step through less than 360° rotation and dwells at that rotated position for a period of time sufficient to expose another portion of the photoresist target to a level above the threshold dose.

8. The method of claim 5 wherein the X-ray mask has a pattern of absorber thereon which shields a portion of the photoresist target that is located at a position spaced away from the axis of rotation on one side of the axis of rotation, and shields a portion of the photoresist target on the other side of the axis of rotation, while allowing a central portion of the photoresist target adjacent to the axis of rotation to be exposed to X-rays which pass through the mask, and wherein the photoresist target is rotated about its axis and the X-ray beam is passed through the X-ray mask until a central portion of the photoresist receives an X-ray exposure greater than the threshold dose while a peripheral portion of the photoresist target, which has received a lesser exposure because it is shielded by the X-ray absorber spaced from the axis of rotation, has received an X-ray exposure less than the threshold dose, and then applying a developer to the photoresist target to remove the central portions of the photoresist adjacent the axis of rotation while leaving the peripheral portions of the photoresist intact, thereby forming a reentrant structure.

9. The method of claim 4 wherein the photoresist material is PMMA having a thickness of at least 5 mm, and wherein the X-rays are provided from a synchrotron and are filtered to provide an absorption length for PMMA of at least one cm.

10. The method of claim 4 wherein the source is a synchrotron source with a critical energy of at least 5,000 eV, and including the step of filtering the X-ray beam from the synchrotron to provide an energy spectrum for the X-ray beam having photon energy levels substantially only greater than 10,000 eV.

11. The method of claim 4 further including the steps of applying a developer to the exposed target object to remove the portions rendered susceptible to the developer and securing the machined photoresist object to a plating base and electroplating metal around the machined photoresist such that the electroplated metal assumes the shape of the machined photoresist, then removing the photoresist to leave the electroplated metal having the shape of the machined photoresist target.

12. The method of claim 11 further including the steps of using the shaped electroplated metal as a mold and applying liquid polymer to the mold to fill the mold and curing the polymer so that the polymer assumes the shape of the metal mold, and then after the polymer is cured, removing the cured polymer from the metal mold with the polymer having the shape of the metal mold.

13. The method of claim 12 further including the steps of utilizing the shaped polymer as a mold and electroplating metal to assume the shape of the surfaces of the polymer, and then dissolving the polymer to leave the shaped metal.

14. The method of claim 4 wherein the X-ray beam is passed through an X-ray mask comprising a membrane of single crystal silicon with a pattern of gold absorber material formed on a surface of the silicon membrane.

15. The method of claim 14 further including the step of passing the X-ray beam through a filter material before the X-ray beam is passed through the X-ray mask.

16. The method of claim 15 wherein the filter material is selected from the group consisting of aluminum, silicon, a combination of aluminum and silicon, and combinations thereof with beryllium.

17. The method of claim 14 wherein the X-ray mask membrane cooperates with the filter material to provide an X-ray beam to the target object which has photon energies which are only greater than about 10,000 eV.

18. The method of claim 4 wherein the X-ray mask and the target photoresist are spaced from each other a distance at of least 5 mm while X-rays are passed through the mask onto the photoresist.

19. The method of claim 4 including the additional step of translating the photoresist target in addition to the step of rotating the target between the steps of exposing the target through the mask to the X-ray beam.

20. The method of claim 19 wherein the X-ray mask is formed to have absorber substantially blocking passage of X-rays therethrough and having an opening formed in the absorber to pass a narrow beam of X-rays therethrough onto the target photoresist, wherein the target photoresist is rotated and translated so that the beam of X-rays strikes different portions of the target and exposes such portions of the target above the threshold dose.

21. A method of exposing X-ray photoresist to X-ray radiation comprising the steps of:
(a) providing X-ray radiation from an X-ray source in a collimated beam having a substantial portion of its power spectrum above a photon energy of 5,000 eV;
(b) filtering the X-ray beam and passing the X-ray beam through an X-ray mask to substantially filter out X-rays having a photon energy below about 5,000 eV and while passing X-rays which have a power spectrum with photon energies greater than about 5,000 eV, the X-ray mask having X-ray absorber material in a pattern; and
(c) applying the X-ray beam passed through the X-ray mask to a plurality of photoresist targets in stacked relation, the plurality of photoresist targets having an entrance surface on which the X-rays are initially incident and an exit surface spaced from the entrance surface, and the step of applying the X-ray beam is carried out by passing the X-ray beam through each photoresist target such that all photoresist targets are exposed simultaneously, the photoresist having an X-ray exposure threshold dose above which the photoresist is rendered susceptible to a developer and maintaining the photoresist in the filtered X-ray beam passed through the X-ray mask for a period of time sufficient to exceed the threshold dose at the exit surface of the photoresist target, wherein the step of filtering is carried out by passing the X-ray beam through a transmission filter and through a substrate of the X-ray mask, and wherein the transmission filter and the X-ray mask substrate are selected and the step of filtering the X-ray beam is carried out to provide a beam passed through the X-ray mask which, for the material of the photoresist targets, can pass through the plurality of targets without significant attenuation such that for an exposure time sufficient to exceed a threshold dose at the exit surface of the last photoresist target on which the X-ray beam is incident the entrance surface of the first photoresist target on which the beam is incident does not receive an exposure dose which would disrupt portions of photoresist adjacent to portions of the photoresist which are exposed to the X-ray beam passed through the mask.

22. The method of claim 21 wherein the photoresist targets comprise PMMA.

23. The method of claim 21 wherein each photoresist target is mounted on its own support substrate so that there are a plurality of substrates, and wherein the X-ray beam is passed through each of the photoresist targets and the substrates on which the targets are supported without significant attenuation by the substrates.

24. The method of claim 23 wherein the substrates have a plating base formed on a surface of each substrate on which the photoresist targets are mounted and wherein the X-ray beam is passed through the substrates without significant attenuation by the substrates with plating base thereon.

25. The method of claim 24 wherein the photoresist targets are formed of PMMA and the support substrates are formed of silicon.

26. The method of claim 25 wherein the step of filtering and passing the X-ray beam through an X-ray mask provides a beam to the photoresist targets having X-ray photon energies substantially only above about 10,000 eV.

27. The method of claim 24 including the additional steps of applying a developer to the exposed and separated photoresist targets to remove the exposed photoresist and expose the plating base, and electroplating a metal into the areas from which the photoresist was removed.

28. Apparatus for use in micromachining of photoresist comprising:
(a) an X-ray source which provides X-ray radiation in a collimated beam which has a substantial portion of its power spectrum above a photon energy of 5,000 eV;
(b) a plurality of X-ray photoresist targets mounted on support substrates in stacked relation;
(c) an X-ray mask mounted in the X-ray beam between the source and the photoresist target, the mask having a substrate and X-ray absorber material formed in a pattern on the substrate and the photoresist support substrates selected such that the X-ray beam from the mask passes through the photoresist targets and the support substrates for the targets to expose each of the targets simultaneously; and (d) a transmission filter mounted in the X-ray beam path between the source and the X-ray mask, the material and thickness of the transmission filter and the material and thickness of the substrate of the X-ray mask selected to filter out X-rays from the X-ray beam having a photon energy at least below about 5,000 eV while passing X-rays through the portion of the mask which does not have the absorber pattern formed thereon which have a power spectrum with photon energies greater than at least about 5,000 eV, wherein the X-ray beam can pass through the photoresist targets and substrates without significant attenuation.

29. The apparatus of claim 28 wherein the transmission filter and mask substrate are chosen such that the X-rays passed to the photoresist target have a power spectrum with a substantial portion of the power in X-rays with photon energies above 20,000 eV.

30. The apparatus of claim 28 wherein the transmission filter and mask substrate are chosen to filter out X-rays from the X-ray beam below about 10,000 eV.

31. The apparatus of claim 28 wherein the material of the transmission filter is selected from the group consisting of a combination of silicon and aluminum, silicon, aluminum, and combinations thereof with beryllium.

32. The apparatus of claim 28 wherein the substrate of the X-ray mask is a silicon wafer.

33. The apparatus of claim 28 including a baseplate in contact with the bottom surface of the photoresist and a heater connected to the baseplate to heat the baseplate to a controlled temperature and to heat the photoresist.

34. The apparatus of claim 28 wherein the support substrates are formed of wafers of silicon.

35. The apparatus of claim 28 wherein the photoresist targets are PMMA.

36. The apparatus of claim 28 wherein each substrate has a surface on which a plating base is formed to which a photoresist target is secured.

37. The apparatus of claim 28 wherein the support substrates are formed of wafers of beryllium oxide.

38. A method of exposing multiple layers of X-ray photoresist to X-ray radiation comprising the steps of:

(a) providing X-ray radiation from an X-ray source in a collimated beam having a substantial portion of its power spectrum above a photon energy of 5,000 eV;

(b) filtering the X-ray beam and passing the X-ray beam through an X-ray mask to substantially filter out X-rays having a photon energy below about 5,000 eV and while passing X-rays which have a power spectrum with photon energies greater than about 5,000 eV, the X-ray mask having X-ray absorber material in a pattern;

(c) mounting a plurality of layers of photoresist targets in a stack, each layer comprising a substrate with a photoresist target supported thereon, each photoresist target having an entrance surface on which X-rays are initially incident and an exit surface; and (d) applying the X-ray beam passed through the X-ray mask to the stack of layers such that the beam passes through each photoresist target and support substrate in the stack such that all photoresist targets are exposed simultaneously, the photoresist targets having an X-ray exposure threshold dose above which the photoresist is rendered susceptible to a developer, and maintaining the stack in the filtered X-ray beam passed through the X-ray mask for a period of time sufficient to exceed the threshold dose at the exit surface of the last photoresist target in the stack on which the beam is incident, wherein the X-ray beam is filtered such that the X-ray beam passes through the photoresists and the substrates without significant attenuation and such that for an exposure time sufficient to provide an exposure at the exit surface of the last photoresist target in the stack sufficient to exceed the threshold dose, the entrance surface of the first photoresist target in the stack does not receive an exposure dose that would disrupt portions of the photoresist adjacent to the portions of the photoresist which are exposed to the X-ray beam passed through the mask.

39. The method of claim 38 wherein the step of filtering comprises passing the X-ray beam through a sheet of filter material and through an X-ray mask substrate.

40. The method of claim 39 wherein the X-ray beam passed through the sheet of filter material and the X-ray mask substrate has photon energies substantially only greater than 10,000 eV.

41. The method of claim 38 including the step of applying a developer to the exposed and separated photoresist targets to remove the portions rendered susceptible to the developer.

42. The method of claim 38 wherein the photoresist material is PMMA.

43. The method of claim 38 wherein the step of filtering is carried out bypassing the X-ray beam through a transmission filter and through a substrate of the X-ray mask.

44. The method of claim 43 wherein the transmission filter is formed of a material selected from the group consisting of silicon, aluminum, a combination of silicon and aluminum, and combinations thereof with beryllium.

45. The method of claim 38 wherein the substrates have a plating base formed on the surface of each substrate on which a photoresist target is mounted, and including the additional steps of applying a developer to the exposed and separated photoresist targets to remove the portions susceptible to the developer and electroplating metal into the areas of the target from which the photoresist has been removed.

46. The method of claim 38 wherein the support substrates supporting the photoresist targets are wafers of material selected from the group consisting of silicon and beryllium oxide.

* * * * *

UNITED STATES PATENT AND TRADEMARK OFFICE
CERTIFICATE OF CORRECTION

PATENT NO.    : 5,679,502
DATED         : October 21, 1997
INVENTOR(S)   : David P. Siddons, et al.

It is certified that error appears in the above-identified patent and that said Letters Patent is hereby corrected as shown below:

In Column 1, line 7 after "Universities, Inc." the following should be added:

--, and with United States Government support awarded by the following agencies: NASA Grant No.: NAG1-1568; NSF Grant No.: ECS-9116566; and ONR Grant No.: N00014-93-1-091.--

Signed and Sealed this

Seventeenth Day of February, 1998

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO. : 5,679,502
DATED : October 21, 1997
INVENTOR(S) : Siddons, et al.

It is certified that error appears in the above-indentified patent and that said Letters Patent is hereby corrected as shown below:

In column 5, line 63 of the patent, delete "2,584" and insert in its place --2.584-- as written in the application on page 10, line 19.

In column 8, line 64 of the patent, delete "$N(hv)=N_o)(hv)e^{-\alpha(hv)d}$" and insert in its place --$N(hv)=N_o (hv)e^{-\alpha(hv)d}$--

In column 9, line 5 of the patent, delete
"$\alpha(hv)\left[\frac{1}{cm}\right]=\frac{N_A density}{amu}\sum_2 index z\mu z(hv)$" and insert in its place
--$\alpha(hv)\left[\frac{1}{cm}\right]=\frac{N_A density}{amu}\sum_Z index z\mu z(hv)$--

In column 20, line 41, delete "bypassing" and insert in its place --by passing--

Signed and Sealed this

Sixth Day of April, 1999

Attest:

Q. TODD DICKINSON

*Attesting Officer*   *Acting Commissioner of Patents and Trademarks*